United States Patent
Choi et al.

(10) Patent No.: US 11,328,204 B2
(45) Date of Patent: May 10, 2022

(54) REALIZATION OF BINARY NEURAL NETWORKS IN NAND MEMORY ARRAYS

(71) Applicant: SanDisk Technologies LLC, Addison, TX (US)

(72) Inventors: Won Ho Choi, San Jose, CA (US); Pi-Feng Chiu, Milpitas, CA (US); Wen Ma, Sunnyvale, CA (US); Minghai Qin, Milpitas, CA (US); Gerrit Jan Hemink, San Ramon, CA (US); Martin Lueker-Boden, Fremont, CA (US)

(73) Assignee: SanDisk Technologies LLC, Addison, TX (US)

(*) Notice: Subject to any disclaimer, the term of this patent is extended or adjusted under 35 U.S.C. 154(b) by 649 days.

(21) Appl. No.: 16/368,347

(22) Filed: Mar. 28, 2019

(65) Prior Publication Data

US 2020/0034697 A1 Jan. 30, 2020

Related U.S. Application Data

(60) Provisional application No. 62/702,713, filed on Jul. 24, 2018.

(51) Int. Cl.
*G11C 16/04* (2006.01)
*G06N 3/04* (2006.01)
(Continued)

(52) U.S. Cl.
CPC .............. *G06N 3/04* (2013.01); *G06N 3/063* (2013.01); *G06N 3/08* (2013.01); *G11C 11/1657* (2013.01);
(Continued)

(58) Field of Classification Search
CPC . G06N 3/04; G06N 3/08; G06N 3/049; G11C 11/54; G11C 16/0483;
(Continued)

(56) References Cited

U.S. PATENT DOCUMENTS

| 7,324,366 B2 | 1/2008 | Bednorz et al. |
| 7,505,347 B2 | 3/2009 | Rinerson et al. |
| (Continued) | | |

FOREIGN PATENT DOCUMENTS

| CN | 110597555 A | 12/2019 |
| CN | 110598858 A | 12/2019 |
| KR | 10-2019-009467 A | 8/2019 |

OTHER PUBLICATIONS

International Search Report & The Written Opinion of the International Searching Authority dated Jul. 30, 2020, International Application No. PCT/US2020/024615.
(Continued)

*Primary Examiner* — Jaehwan Oh
(74) *Attorney, Agent, or Firm* — Vierra Magen Marcus LLP

(57) ABSTRACT

Use of a NAND array architecture to realize a binary neural network (BNN) allows for matrix multiplication and accumulation to be performed within the memory array. A unit synapse for storing a weight of a BNN is stored in a pair of series connected memory cells. A binary input is applied as a pattern of voltage values on a pair of word lines connected to the unit synapse to perform the multiplication of the input with the weight by determining whether or not the unit synapse conducts. The results of such multiplications are determined by a sense amplifier, with the results accumulated by a counter.

20 Claims, 22 Drawing Sheets

(51) Int. Cl.
  *G11C 11/56* (2006.01)
  *G11C 13/00* (2006.01)
  *G11C 11/16* (2006.01)
  *G06N 3/08* (2006.01)
  *G06N 3/063* (2006.01)
  *G11C 16/26* (2006.01)

(52) U.S. Cl.
  CPC ...... *G11C 11/1673* (2013.01); *G11C 11/5607* (2013.01); *G11C 11/5678* (2013.01); *G11C 11/5685* (2013.01); *G11C 13/003* (2013.01); *G11C 13/0004* (2013.01); *G11C 13/004* (2013.01); *G11C 13/0028* (2013.01); *G11C 16/0483* (2013.01); *G11C 16/26* (2013.01); *G11C 2213/79* (2013.01)

(58) Field of Classification Search
  CPC ............ G11C 2213/77; G11C 2213/75; G06F 2207/4824; H01L 2924/1443
  See application file for complete search history.

(56) References Cited

U.S. PATENT DOCUMENTS

| | | | |
|---|---|---|---|
| 8,416,624 | B2 | 4/2013 | Lei et al. |
| 8,634,247 | B1 | 1/2014 | Sprouse et al. |
| 8,634,248 | B1 | 1/2014 | Sprouse et al. |
| 8,773,909 | B2 | 7/2014 | Li et al. |
| 8,780,632 | B2 | 7/2014 | Sprouse et al. |
| 8,780,633 | B2 | 7/2014 | Sprouse et al. |
| 8,780,634 | B2 | 7/2014 | Sprouse et al. |
| 8,780,635 | B2 | 7/2014 | Li et al. |
| 8,792,279 | B2 | 7/2014 | Li et al. |
| 8,811,085 | B2 | 8/2014 | Sprouse et al. |
| 8,817,541 | B2 | 8/2014 | Li et al. |
| 9,098,403 | B2 | 8/2015 | Sprouse et al. |
| 9,104,551 | B2 | 8/2015 | Spouse et al. |
| 9,116,796 | B2 | 8/2015 | Sprouse et al. |
| 9,384,126 | B1 | 7/2016 | Sprouse et al. |
| 9,430,735 | B1* | 8/2016 | Vali ........................... G06N 3/04 |
| 9,887,240 | B2 | 2/2018 | Shimabukuro et al. |
| 9,965,208 | B1* | 5/2018 | Roohparvar .......... G06F 3/0688 |
| 10,127,150 | B2 | 11/2018 | Sprouse et al. |
| 10,459,724 | B2 | 10/2019 | Yu et al. |
| 10,535,391 | B2 | 1/2020 | Osada et al. |
| 2014/0133228 | A1 | 5/2014 | Sprouse et al. |
| 2014/0133233 | A1 | 5/2014 | Li et al. |
| 2014/0133237 | A1 | 5/2014 | Sprouse et al. |
| 2014/0136756 | A1 | 5/2014 | Sprouse et al. |
| 2014/0136757 | A1 | 5/2014 | Sprouse et al. |
| 2014/0136758 | A1 | 5/2014 | Sprouse et al. |
| 2014/0136760 | A1 | 5/2014 | Sprouse et al. |
| 2014/0136762 | A1 | 5/2014 | Li et al. |
| 2014/0136763 | A1 | 5/2014 | Li et al. |
| 2014/0136764 | A1 | 5/2014 | Li et al. |
| 2014/0156576 | A1 | 6/2014 | Nugent |
| 2014/0136761 | A1 | 7/2014 | Li et al. |
| 2014/0294272 | A1 | 10/2014 | Madabhushi et al. |
| 2015/0324691 | A1* | 11/2015 | Dropps .................. G06N 3/063 706/25 |
| 2016/0026912 | A1 | 1/2016 | Falcon et al. |
| 2016/0054940 | A1* | 2/2016 | Khoueir .................. G06F 12/06 706/15 |
| 2017/0017879 | A1 | 1/2017 | Kataeva |
| 2017/0054032 | A1* | 2/2017 | Tsukamoto ....... H01L 27/11526 |
| 2017/0098156 | A1 | 4/2017 | Nino et al. |
| 2017/0228637 | A1 | 8/2017 | Santoro et al. |
| 2018/0039886 | A1 | 2/2018 | Umuroglu et al. |
| 2018/0075339 | A1 | 3/2018 | Ma et al. |
| 2018/0082181 | A1 | 3/2018 | Brothers et al. |
| 2018/0144240 | A1 | 5/2018 | Garbin et al. |
| 2018/0315473 | A1 | 11/2018 | Yu et al. |
| 2019/0108436 | A1 | 4/2019 | David et al. |
| 2019/0251425 | A1 | 8/2019 | Jaffari et al. |
| 2020/0034697 | A1 | 1/2020 | Choi et al. |
| 2021/0110244 | A1* | 4/2021 | Hoang ................... G06N 3/063 |

OTHER PUBLICATIONS

Chiu, Pi-Feng, et al., "A Binarized Neural Network Accelerator with Differential Crosspoint Memristor Array for Energy-Efficient MAC Operations," 2019 IEEE International Symposium on Circuits and Systems (ISCAS), May 2019, Abstract only.

Sun, Xiaoyu, et al., "Low-VDD Operation of SRAM Synaptic Array for Implementing Ternary Network," IEEE Transactions on Very Large Scale Integration (VLSI) Systems, vol. 25, No. 10, Jul. 2017, Abstract only.

Kim, Hyeonuk, et al., "NAND-Net: Minimizing Computational Complexity of In-Memory Processing for Binary Neural Networks," 2019 IEEE International Symposium on High Performance Computer Architecture (HPCA), Mar. 2019, Abstract only.

English Abstract of KR Publication No. KR 10-2019-0094679 published Aug. 14, 2019.

Zheng, Shixuan, et al., "An Efficient Kernel Transformation Architecture for Binary- and Ternary-Weight Neural Network Inference," DAC 18, Jun. 24-29, 2018, 6 pages.

Notice of Allowance dated Feb. 20, 2020, U.S. Appl. No. 16/405,178, filed May 7, 2019.

Resch, Salonik, et al., "PIMBALL: Binary Neural Networks in Spintronic Memory," ACM Trans. Arch. Code Optim., vol. 37, No. 4, Article 111, Aug. 2018, 25 pages.

Zamboni, Maurizio, et al., "In-Memory Binary Neural Networks," Master's Thesis, Politecino Di Torino, Apr. 10, 2019, 327 pages.

Natsui, Masanori, et al., "Design of an energy-efficient XNOR gate based on MTJ-based nonvolatile logic-in-memory architecture for binary neural network hardware," Japanese Journal of Applied Physics 58, Feb. 2019, 8 pages.

Notice of Allowance dated Jul. 12, 2021, U.S. Appl. No. 16/368,441, filed Mar. 28, 2019.

Kim, Hyeonuk, et al., "NAND-Net: Minimizing Computational Complexity of In-Memory Processing for Binary Neural Networks," 2019 IEEE International Symposium on High Performance Computer Architecture (HPCA), Mar. 2019.

Ji, H., et al., "ReCOM: An efficient resistive accelerator for compressed deep neural networks," 2018 Design, Automation & Test in Europe Conference & Exhibition, 2018, pp. 237-240.

Notice of Allowance dated Mar. 11, 2020, U.S. Appl. No. 16/414,143, filed May 16, 2019.

U.S. Appl. No. 16/901,302, filed Jun. 15, 2020.

Baugh, Charles R., et al., "A Two's Complement Parallel Array Multiplication Algorithm," IEEE Transactions on Computers, vol. C-22, No. 12, Dec. 1973, 3 pages.

Hoang, Tung Thanh, et al., "Data-Width-Driven Power Gating of Integer Arithmetic Circuits," IEEE Computer Society Annual Symposium on VLSI, Jul. 2012, 6 pages.

Choi, Won Ho, et al., "High-precision Matrix-Vector Multiplication Core using Binary NVM Cells," Powerpoint, Western Digital Research, downloaded on Jun. 15, 2020, 7 pages.

Ni, Leibin, et al., "An Energy-Efficient Digital ReRAM-Crossbar-Based CNN With Bitwise Parallelism," IEEE Journal of Exploratory Solid-State Computational Devices and Circuits, May 2017, 10 pages.

Zhou, Shuchang, et al., "DoReFa-Net: Training Low Bitwidth Convolutional Neural Networks with Low Bitwidth Gradients," [arXiv.org > cs > arXiv:1606.06160], Feb. 2, 2018, 13 pages.

U.S. Appl. No. 16/908,864, filed Jun. 23, 2020.

International Search Report & The Written Opinion of the International Searching Authority dated Jul. 9, 2020, International Application No. PCT/US2020/024612.

Houxiang Ji, et al., "RECOM: An Efficient Resistive Accelerator for Compressed Deep Neural Networks," in 2018 Design, Automation & Test in Europe Conference & Exhibition, Mar. 23, 2018, Abstract only.

(56) References Cited

OTHER PUBLICATIONS

Yang, Tzu-Hsien, et al., "Sparse ReRAM Engine: Joint Exploration of Activation and Weight Sparsity in Compressed Neural Networks," Computer Architecture, pp. 236-249, Jun. 26, 2019, Abstract only.
U.S. Appl. No. 16/653,346, filed Oct. 15, 2019.
U.S. Appl. No. 16/653,365, filed Oct. 15, 2019.
Simon, Noah, et al., "A Sparse-Group Lasso," Journal of Computational and Graphical Statistics, vol. 22, No. 2, pp. 231-245, downloaded by Moskow State Univ. Bibliote on Jan. 28, 2014.
"CS231n Convolutional Neural Networks for Visual Recognition," [cs231.github.io/neural-networks-2/#reg], downloaded on Oct. 15, 2019, pp. 1-15.
Krizhevsky, Alex, et al., "ImageNet Classification with Deep Convolutional Neural Networks," [http://code.google.com/p/cuda-convnet/], downloaded on Oct. 15, 2019, 9 pages.
Shafiee, Ali, et al., "ISAAC: A Convolutional Neural Network Accelerator with In-Situ Analog Arithmetic in Crossbars," ACM/IEEE 43rd Annual International Symposium on Computer Architecture (ISCA), Oct. 5, 2016, 13 pages.
Han, Song, et al., "Learning both Weights and Connections for Efficient Neural Networks," Conference paper, NIPS, Oct. 2015, 9 pages.
Jia, Yangqing, "Learning Semantic Image Representations at a Large Scale," Electrical Engineering and CS, University of Berkeley, Technical Report No. UCB/EECS-2014-93, May 16, 2014, 104 pages.
Wen, Wei, et al., "Learning Structured Sparsity in Deep Neural Networks," 30th Conference on Neural Information Processing Systems (NIPS 2016), Nov. 2016, 9 pages.
Wang, Peiqi, et al., "SNrram: An Efficient Sparse Neural Network Computation Architecture Based on Resistive Random-Access Memory," DAC '18, Jun. 24-29, 2018, 6 pages.
Rastegari, Mohammad et al., "XNOR-Net: ImageNet Classification Using Binary Convolutional Neural Networks," proceedings ECCV 2016, Aug. 2016, 55 pages.
Wan, Diwen, et al., "TBN: Convolutional Neural Network with Ternary Inputs and Binary Weights," ECCV 2018, Oct. 2018, 18 pages.

Chen, Yu-Hsin, et al., "Eyeriss: An Energy-Efficient Reconfigurable Accelerator for Deep Convolutional Neural Networks," IEEE Journal of Solid-State Circuits, Feb. 2016, 12 pages.
Sun, Xiaoyu, et al., "Fully Parallel RRAM Synaptic Array for Implementing Binary Neural Network with (+1, =1) Weights and (+1, 0) Neurons," 23rd Asia and South Pacific Design Automation Conference, Jan. 2018, 6 pages.
Gonugondla, Sujan K., et al., "Energy-Efficient Deep In-memory Architecture for NAND Flash Memories," IEEE International Symposium on Circuits and Systems (ISCAS), May 2018, 5 pages.
Nakahara, Hiroki, et al., "A Memory-Based Realization of a Binarized Deep Convolutional Neural Network," International Conference on Field-Programmable Technology (FPT), Dec. 2016, 4 pages.
Takeuchi, Ken, "Data-Aware NAND Flash Memory for Intelligent Computing with Deep Neural Network," IEEE International Electron Devices Meeting (IEDM), Dec. 2017, 4 pages.
Mochida, Reiji, et al., "A4M Synapses integrated Analog ReRAM based 66.5 TOPS/W Neural-Network Processor with Cell Current Controlled Writing and Flexible Network Architecture," Symposium on VLSI Technology Digest of Technical Papers, Jun. 2018, 2 pages.
Chiu, Pi-Feng, et al., "A Differential 2R Crosspoint RRAM Array With Zero Standby Current," IEEE Transactions on Circuits and Systems—II: Express Briefs, vol. 62, No. 5, May 2015, 5 pages.
Chen, Wei-Hao, et al., "A 65nm 1Mb Nonvolatile Computing-in-Memory ReRAM Macro with Sub-16ns Mulitply-and-Accumulate for Binary DNN AI Edge Processors," IEEE International Solid-State Circuits Conference, Feb. 2018, 3 pages.
Liu, Rui, et al., "Parallelizing SRAM Arrays with Customized Bit-Cell for Binary Neural Networks," DAC '18, Jun. 2018, 6 pages.
Courbariaux, Matthieu, et al., "Binarized Neural Networks: Training Neural Networks with Weights and Activations Constrained to +1 or −1," arXiv.org, Mar. 2016, 11 pages.
U.S. Appl. No. 62/702,713, filed Jul. 24, 2018.
U.S. Appl. No. 16/052,420, filed Aug. 1, 2018.
U.S. Appl. No. 16/368,441, filed Mar. 28, 2019.
U.S. Appl. No. 16/405,178, filed May 7, 2019.
U.S. Appl. No. 16/414,143, filed May 16, 2019.

* cited by examiner

| Input (IN) | Weight (W) | Output (IN x W) |
|---|---|---|
| -1 | -1 | +1 |
| -1 | +1 | -1 |
| +1 | -1 | -1 |
| +1 | +1 | +1 |
Figure 9
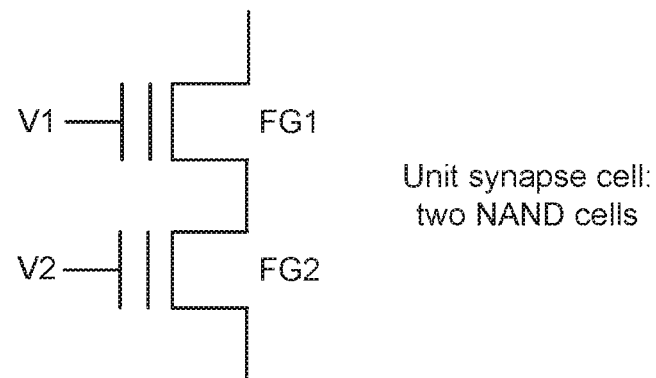
Figure 10
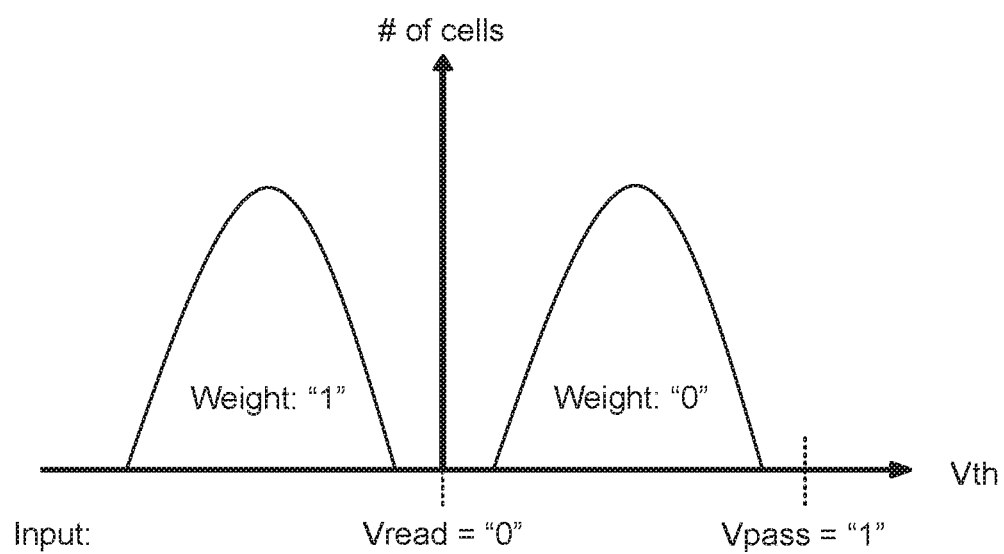
Figure 11

| Case | Input logic | Input voltage | | Weight logic | Weight Vth | | Output logic | Discharged current | Output voltage |
|---|---|---|---|---|---|---|---|---|---|
| | | V1 | V2 | | FG1 | FG2 | | | |
| | | "1" = Vpass | "0" = Vread | | | | | | |
| 1 | -1 | 1 | 0 | -1 | 0 | 1 | +1 | Icell | ΔV drop |
| 2 | +1 | 0 | 1 | -1 | 0 | 1 | -1 | x | No drop |
| 3 | -1 | 1 | 0 | +1 | 1 | 0 | -1 | x | No drop |
| 4 | +1 | 0 | 1 | +1 | 1 | 0 | +1 | Icell | ΔV drop |

Figure 13

| BNN algebra | |
|---|---|
| Binary $I^{bnn}$ | 1 -1 1 1 -1 -1 1 -1 |
| Binary $W^{bnn}$ | -1 1 1 -1 -1 -1 1 -1 |
| Accumulate add | sum( -1 -1 1 -1 1 1 1 1 ) |
| Dot-product $P^{bnn\_dec}$ | 2 |
| Derived $P^{bnn\_dec}$ | $2 * CNT^{bnn\_out} - S$  (Eq. 1) |

Figure 15

| SLC NAND-based BNN | | |
|---|---|---|
| $I^{bnn}$ | | 1 0 1 1 0 0 1 0 |
| $W^{bnn}$ | | 0 1 1 0 0 0 1 0 |
| SA output | XNOR( | 0 0 1 0 1 1 1 1 ) |
| $CNT^{bnn\_out}$ | popcount | 5 (count number of 1 bits) |

Figure 16

REALIZATION OF BINARY NEURAL NETWORKS IN NAND MEMORY ARRAYS

CROSS-REFERENCE TO RELATED APPLICATIONS

This application claims priority from U.S. Provisional Application No. 62/702,713, filed Jul. 24, 2018, and is related to an application entitled "Realization of Neural Networks with Ternary Inputs and Binary Weights in NAND Memory Arrays" by Hoang et al., filed concurrently with the present application, both of which are incorporated herein by reference.

BACKGROUND

Artificial neural networks are finding increasing usage in artificial intelligence and machine learning applications. In an artificial neural network, a set of inputs is propagated through one or more intermediate, or hidden, layers to generate an output. The layers connecting the input to the output are connected by sets of weights that are generated in a training or learning phase by determining a set of a mathematical manipulations to turn the input into the output, moving through the layers calculating the probability of each output. Once the weights are established, they can be used in the inference phase to determine the output from a set of inputs. Although such neural networks can provide highly accurate results, they are extremely computationally intensive, and the data transfers involved in reading the weights connecting the different layers out of memory and transferring them into the processing units of a processing unit can be quite intensive.

BRIEF DESCRIPTION OF THE DRAWINGS

Like-numbered elements refer to common components in the different figures.

FIG. 9 is a table illustrating the output of a binary neural network in response to the different input-weight combinations.

FIG. 10 illustrates an embodiment for a unit synapse cell for storing a binary weight in a pair of series connected memory cells.

FIG. 11 illustrates the distribution of threshold voltages for the storage of data states on a binary, or single level cell (SLC), memory.

FIGS. 12 and 13 illustrate an embodiment for implementing a binary neural network using a pair of series connected SLC memory cells as unit synapse.

FIGS. 15 and 16 consider an example of the computation of a dot-product for the binary neural network algebra and how to implement this using a counter based summation digital circuit for an SLC NAND binary neural network (BNN) embodiment.

DETAILED DESCRIPTION

To reduce the computational complexity and relax the memory requirements of neural networks, Binary Neural Networks (BNNs) have been introduced. In BNNs, the weights and inputs of the neural network are truncated into binary values (−1, +1) and the binary arithmetic simplifies multiplication and addition to XNOR and bit-count operations. The following disclosure presents techniques for exploiting the structure of NAND memory for the storage of the weights of binary neural networks and for the execution of the multiply-and-accumulation operations within the NAND memory.

Each binary weight is stored in a unit synapse formed of a pair of series connected binary memory cells, such as a pair of adjacent memory cells on a NAND string, where one of the memory cells is in a programmed state and the other in an erased state. Depending on which memory cell of the unit synapse is in the programmed and which memory cell is in the erased state, the unit synapse will either be in the −1 or +1 weight. The binary input is then applied as a voltage pattern on the corresponding word lines, in which one of the word line pair is at a read voltage (for which only the erased state memory cell will conduct) and the other one of the word line pair is at a pass voltage (for which a memory cell in either state will conduct). Depending on which word line of the word line pair is at which value, the input will either be a −1 or +1 input. By applying the input to the word line pair, the unit synapse (and corresponding NAND string) will either conduct or not, depending whether or not the input and the weight match. The result can be determined by a sense amplifier connected to a corresponding bit line. By sequentially working through the input/unit synapse pairs along a NAND string and accumulating the results of the sense amplifier, the multiply- and accumulate operations of propagating an input through a layer of a neural network can be performed. As the word lines of the array span multiple NAND strings, the operation can be performed concurrently for the binary weights of multiple unit synapse.

The degree of parallelism can be increased by the introduction of multi-bit sense amplifiers, so that the unit synapse from different memory blocks of the array can be sensed concurrently. Further increases in parallelism can be obtained by concurrent sensing on multiple planes and pipelining the output of one plane, corresponding to one layer of a neural network, to be the input of another plane, corresponding to the subsequent layer of a neural network.

Figure 1:
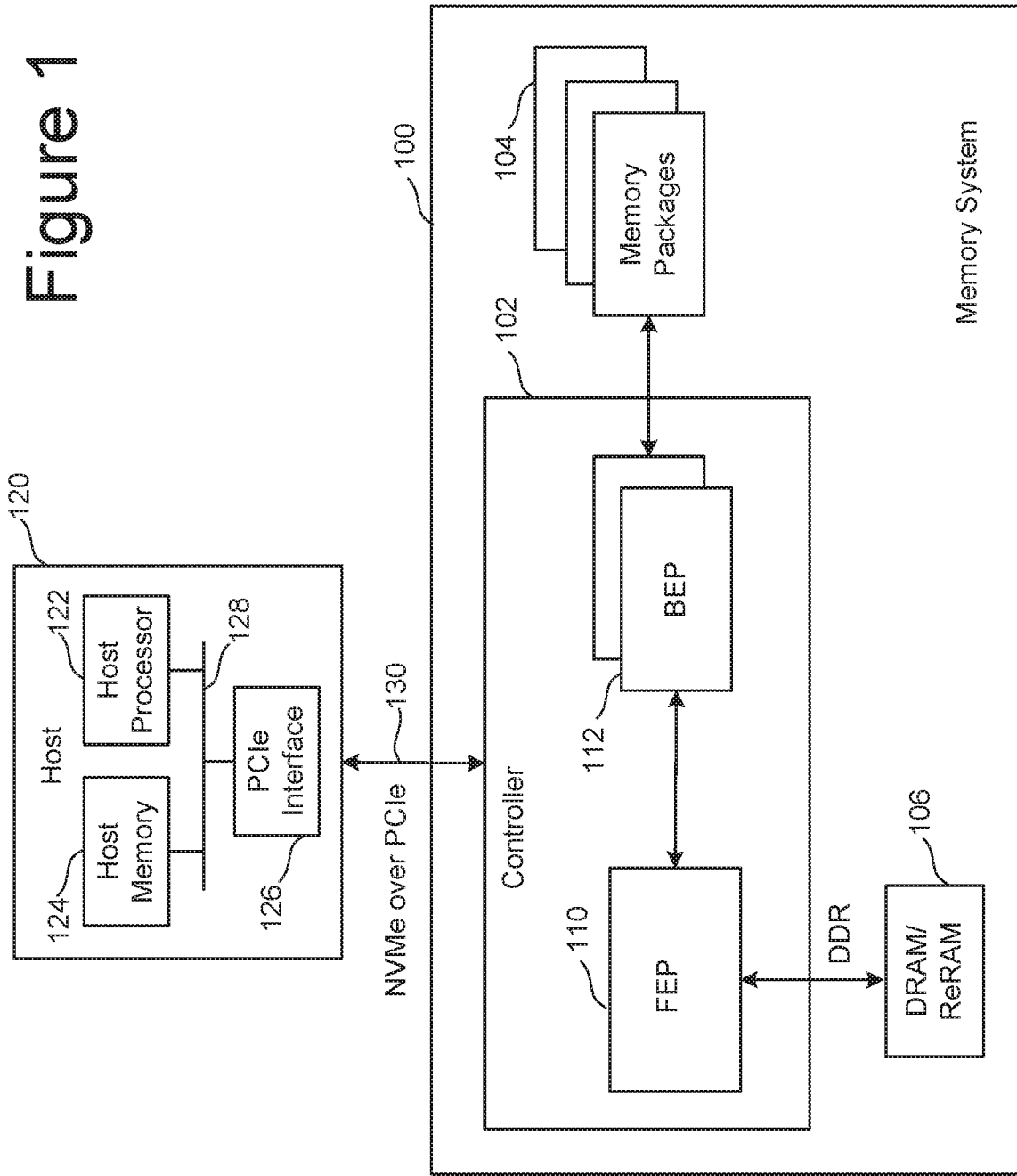
FIG. 1 is a block diagram of one embodiment of a memory system connected to a host.

FIG. 1 is a block diagram of one embodiment of a memory system 100 connected to a host 120. Memory system 100 can implement the technology proposed herein, where the neural network inputs or other data are received from the host 120. Depending on the embodiment, the inputs can be received from the host 120 and then provided to the memory packages 104 for inferencing on the weights previously programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a Controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the Controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
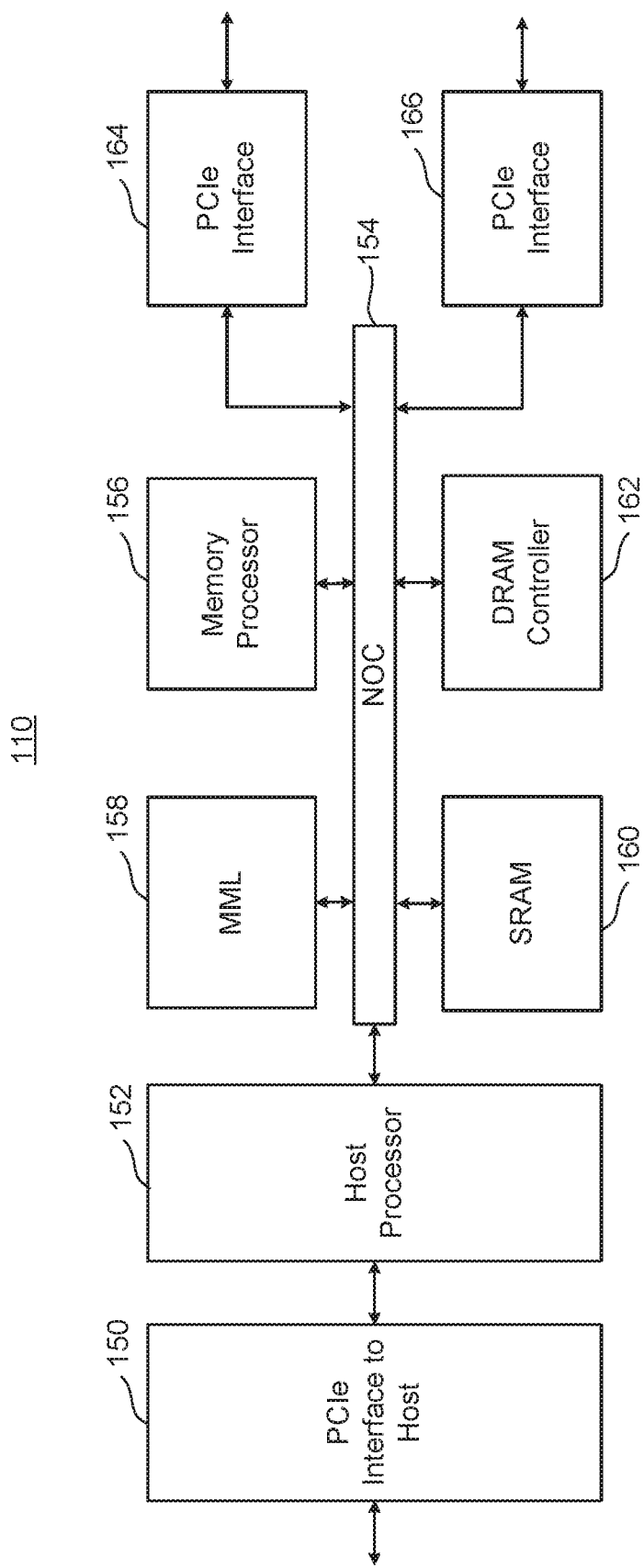
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
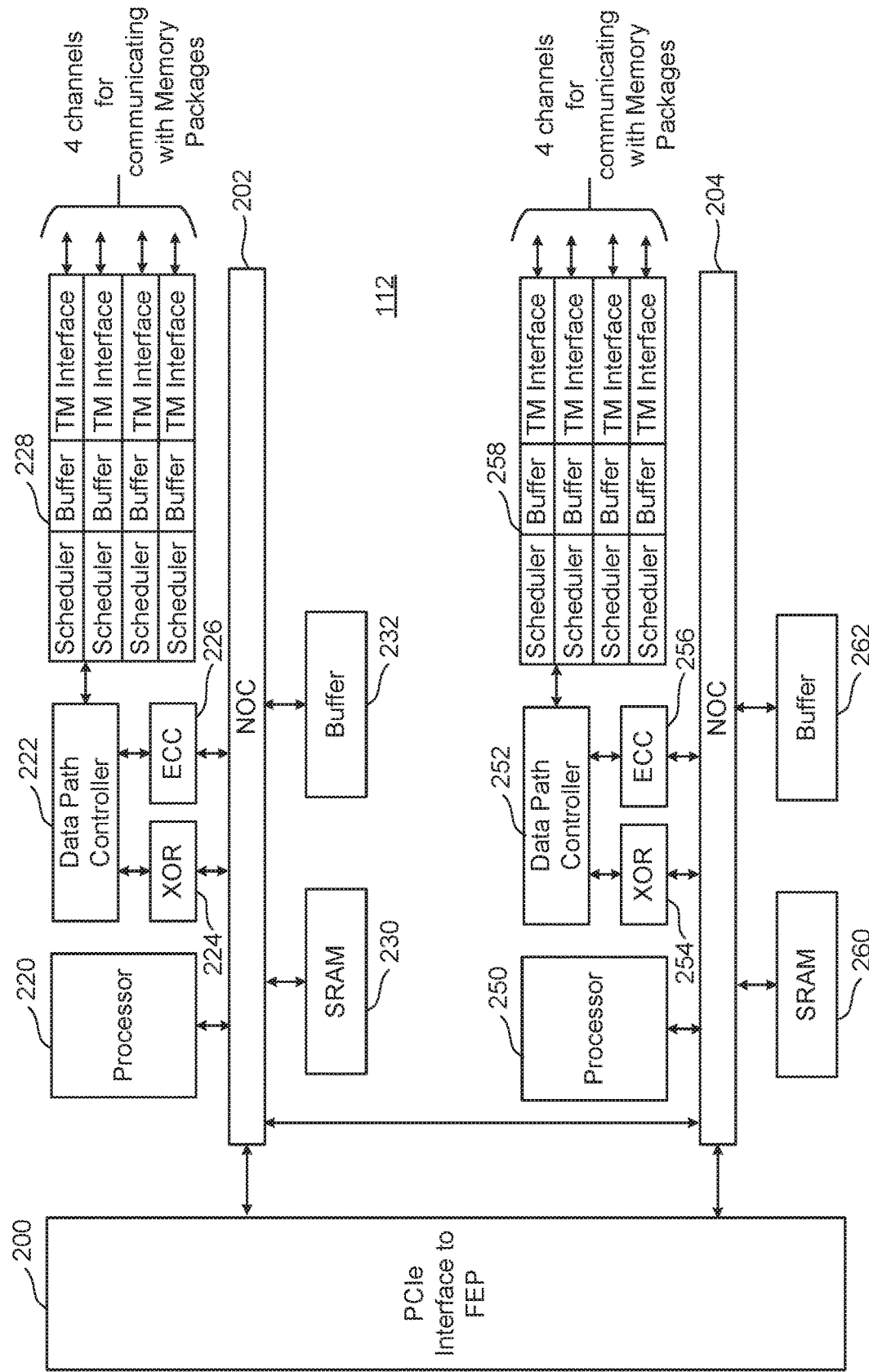
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
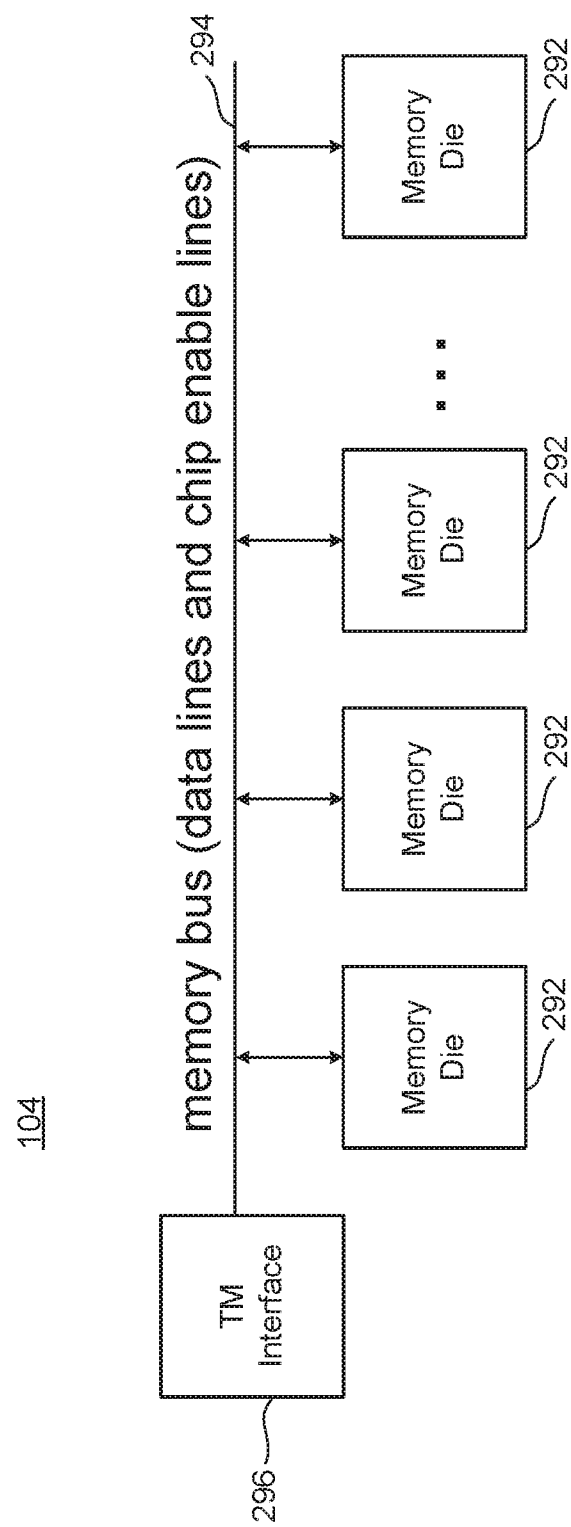
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5:
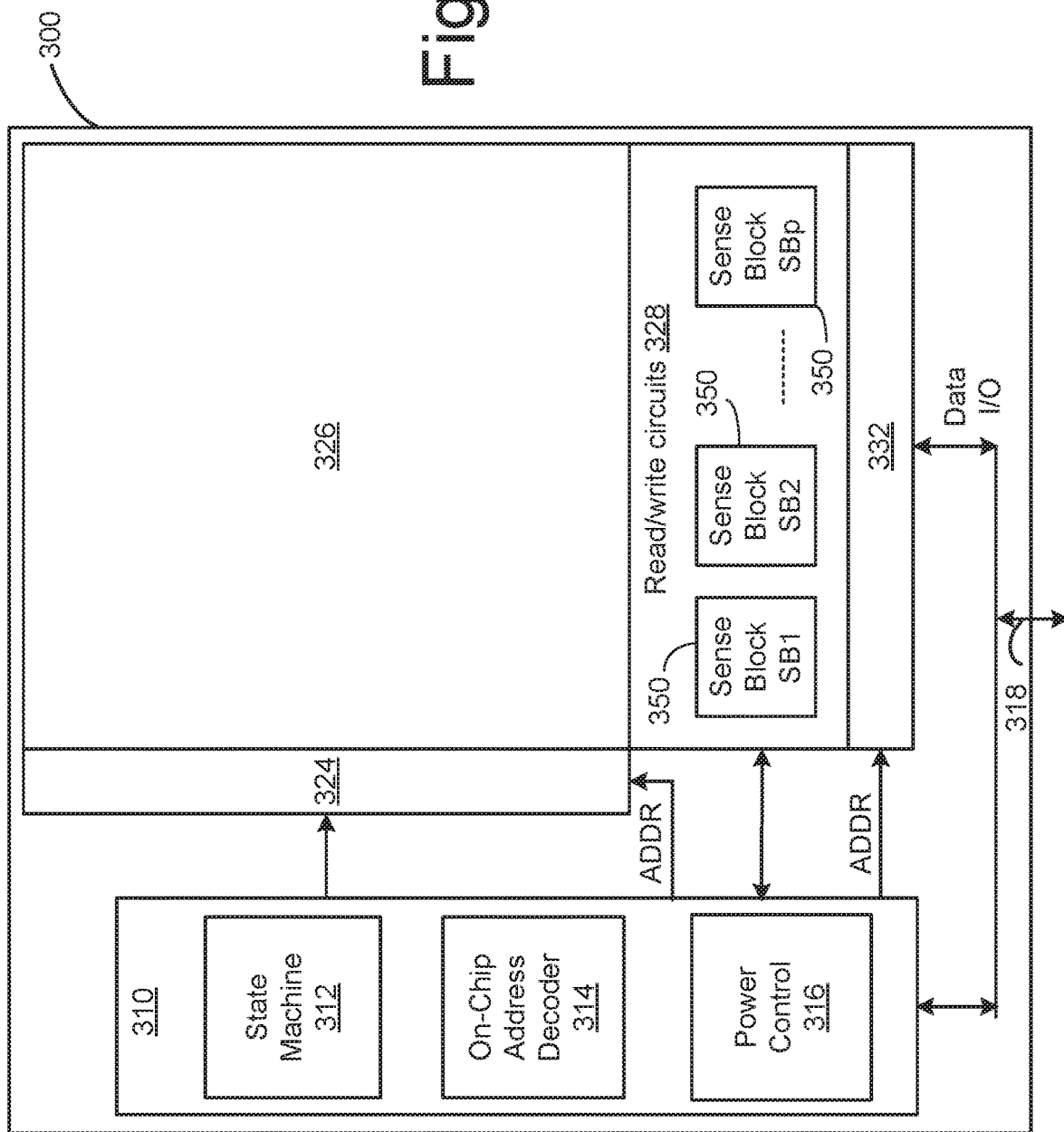
FIG. 5 is a block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 126 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the Controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, and a power control circuit 316. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM fuses and other storage devices for storing default values such as base voltages and other parameters.

The on-chip address decoder 314 provides an address interface between addresses used by Controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" refers to a controller, a state machine, a micro-controller and/or control circuitry 310, or other analogous circuits that are used to control non-volatile memory.

In one embodiment, memory structure 326 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 6:
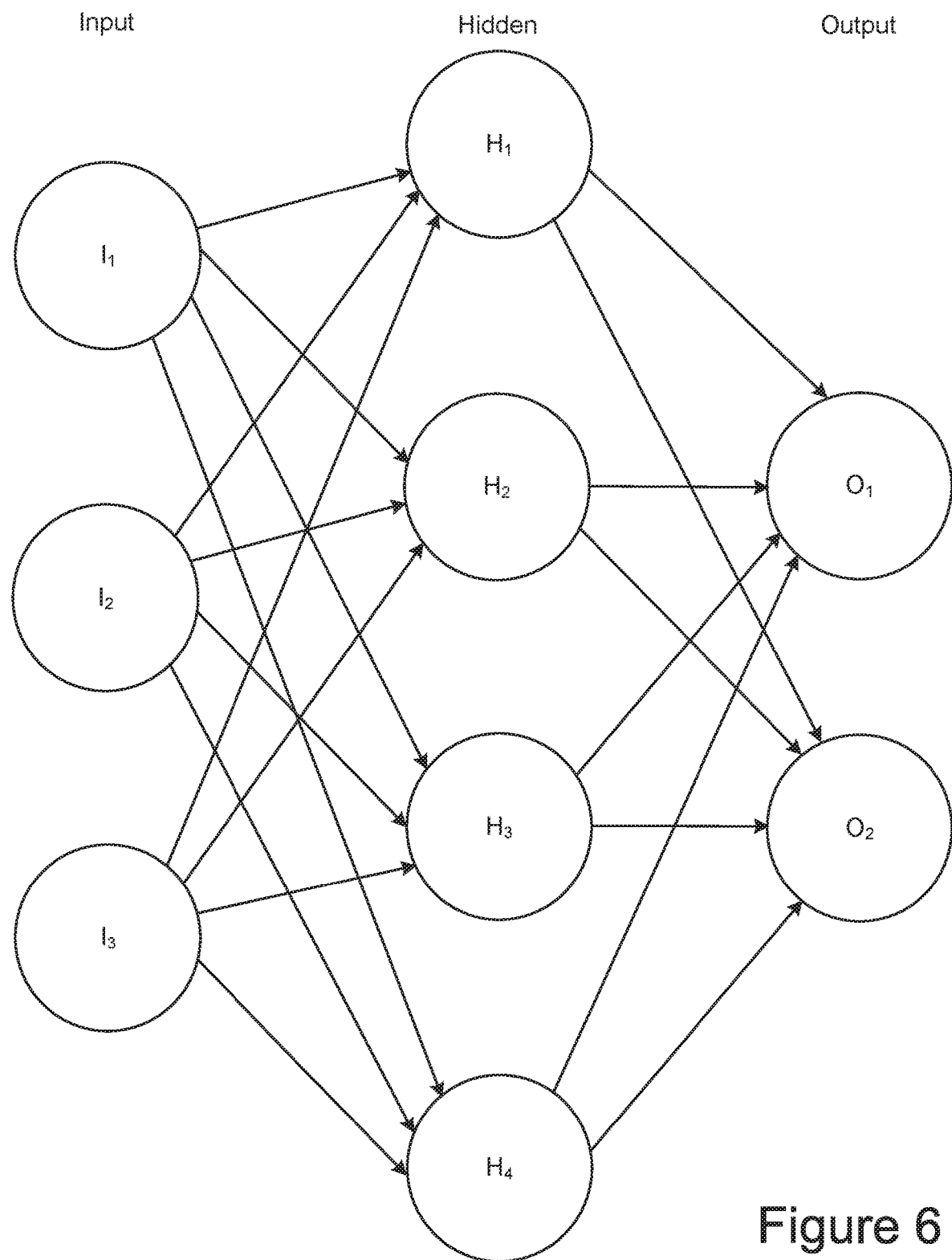
FIG. 6 illustrates a simple example of an artificial neural network.

Turning now to types of data that can be stored on non-volatile memory devices, a particular example of the type of data of interest in the following discussion is the weights used is in deep neural networks. An artificial neural network is formed of one or more intermediate layers between an input layer and an output layer. The neural network finds mathematical manipulation to turn the input into the output, moving through the layers calculating the probability of each output. FIG. 6 illustrates a simple example of an artificial neural network.

In FIG. 6 an artificial neural network is represented as an interconnected group of nodes or artificial neurons, represented by the circles, and a set of connections from the output of one artificial neuron to the input of another. The example shows three input nodes ($I_1$, $I_2$, $I_3$) and two output nodes ($O_1$, $O_2$), with an intermediate layer of four hidden or intermediate nodes ($H_1$, $H_2$, $H_3$, $H_4$). The nodes, or artificial neurons/synapses, of the artificial neural network are implemented by logic elements of a host or other processing system as a mathematical function that receives one or more inputs and sums them to produce an output. Usually each input is separately weighted and the sum is passed through the node's mathematical function to provide the node's output.

In common artificial neural network implementations, the signal at a connection between nodes (artificial neurons/synapses) is a real number, and the output of each artificial neuron is computed by some non-linear function of the sum of its inputs. Nodes and their connections typically have a weight that adjusts as a learning process proceeds. The weight increases or decreases the strength of the signal at a connection. Nodes may have a threshold such that the signal is only sent if the aggregate signal crosses that threshold. Typically, the nodes are aggregated into layers. Different layers may perform different kinds of transformations on their inputs. Signals travel from the first layer (the input layer), to the last layer (the output layer), possibly after traversing the layers multiple times. Although FIG. 6 shows only a single intermediate or hidden layer, a complex deep neural network (DNN) can have many such intermediate layers.

An artificial neural network is "trained" by supplying inputs and then checking and correcting the outputs. For example, a neural network that is trained to recognize dog breeds will process a set of images and calculate the probability that the dog in an image is a certain breed. A user can review the results and select which probabilities the network should display (above a certain threshold, etc.) and return the proposed label. Each mathematical manipulation as such is considered a layer, and complex neural networks have many layers. Due to the depth provided by a large number of intermediate or hidden layers, neural networks can model complex non-linear relationships as they are trained.

Figure 7B:
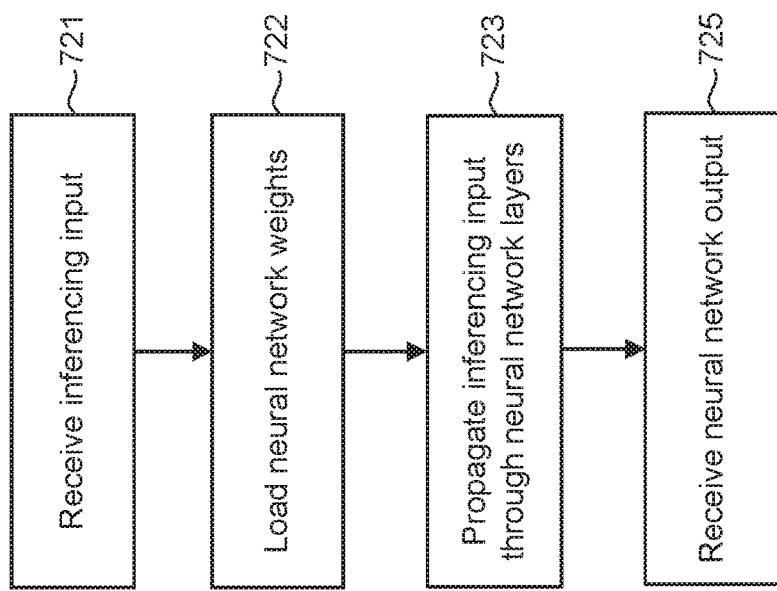
FIG. 7B is a flowchart describing one embodiment of a process for inference using a neural network.
Figure 7A:
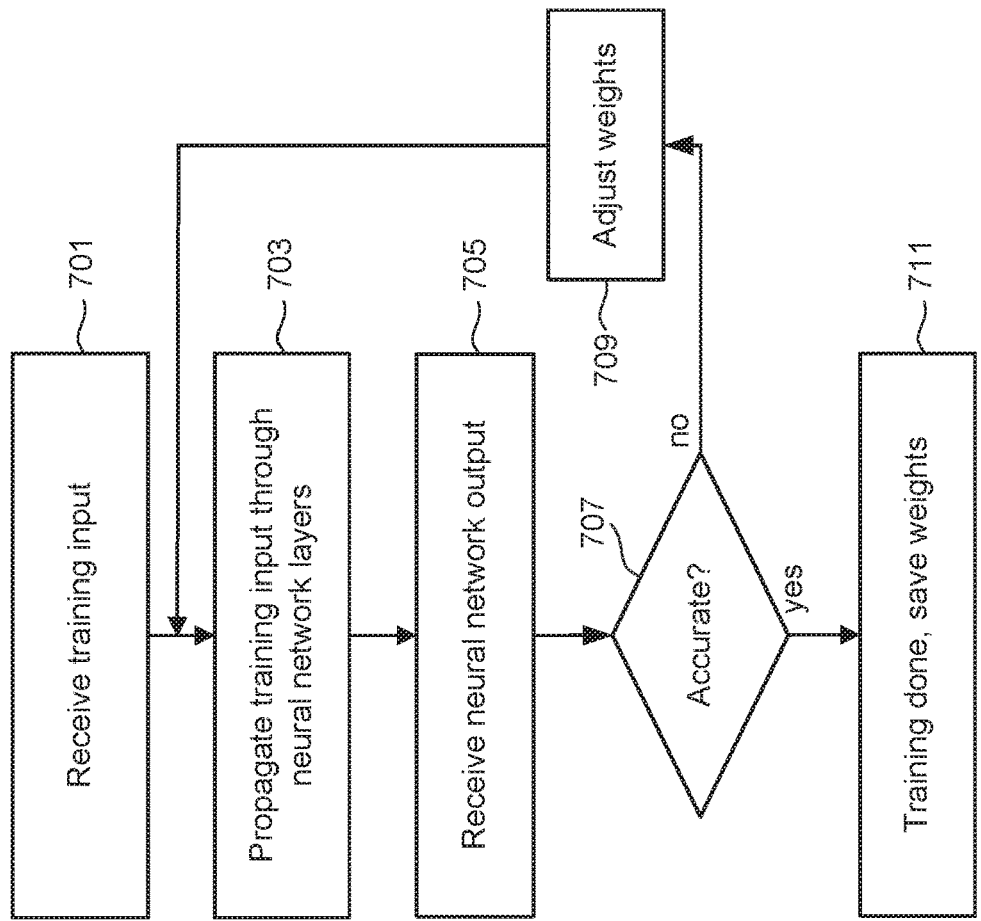
FIG. 7A is a flowchart describing one embodiment of a process for training a neural network to generate a set of weights.

FIG. 7A is a flowchart describing one embodiment of a process for training a neural network to generate a set of weights. The training process is often performed in the cloud, allowing additional or more powerful processing the accessed. At step 701, the input, such as a set of images, is received at the input nodes (e.g., $I_1$, $I_2$, $I_3$ in FIG. 6). At step 703 the input is propagated through the nodes of the hidden intermediate layers (e.g., $H_1$, $H_2$, $H_3$, $H_4$ in FIG. 6) using the current set of weights. The neural network's output is then received at the output nodes (e.g., $O_1$, $O_2$ in FIG. 6) in step 705. In the dog breed example of the preceding paragraph, the input would be the image data of a number of dogs, and the intermediate layers use the current weight values to calculate the probability that the dog in an image is a certain breed, with the proposed dog breed label returned at step 705. A user can then review the results at step 707 to select which probabilities the neural network should return and decide whether the current set of weights supply a sufficiently accurate labelling and, if so, the training is complete (step 711). If the result is not sufficiently accurate, the neural network adjusts the weights at step 709 based on the probabilities the user selected, followed by looping back to step 703 to run the input data again with the adjusted weights. Once the neural network's set of weights have been determined, the can be used to "inference," which is the process of using the determined weights to generate an output result from data input into the neural network. Once the weights are determined at step 711, they can then be stored in non-volatile memory for later use, where the storage of these weights in non-volatile memory is discussed in further detail below.

FIG. 7B is a flowchart describing a process for the inference phase of supervised learning using a neural network to predict the "meaning" of the input data using an estimated accuracy. Depending on the case, the neural network may be inferenced both at cloud and by an edge device's (e.g., smart phone, automobile process, hardware accelerator) processor. At step 721, the input is received, such as the image of a dog in the example used above. If the previously determined weights are not present in the device running the neural network application, they are loaded at step 722. For example, on a host processor executing the neural network, the weight could be read out of an SSD in which they are stored and loaded into RAM on the host device. At step 723, the input data is then propagated through the neural network's layers. Step 723 will be similar to step 703 of FIG. 7B, but now using the weights established at the end of the training process at step 711. After propagating the input through the intermediate layer, the output is then provided at step 725.

Neural networks are typically feedforward networks in which data flows from the input layer, through the intermediate layers, and to the output layer without looping back. At first, in the training phase of supervised learning as illustrated by FIG. 7A, the neural network creates a map of virtual neurons and assigns random numerical values, or "weights", to connections between them. The weights and inputs are multiplied and return an output between 0 and 1. If the network does not accurately recognize a particular pattern, an algorithm adjusts the weights. That way the algorithm can make certain parameters more influential (by increasing the corresponding weight) or less influential (by decreasing the weight) and adjust the weights accordingly until it determines a set of weights that provide a sufficiently correct mathematical manipulation to fully process the data.

Figure 8:
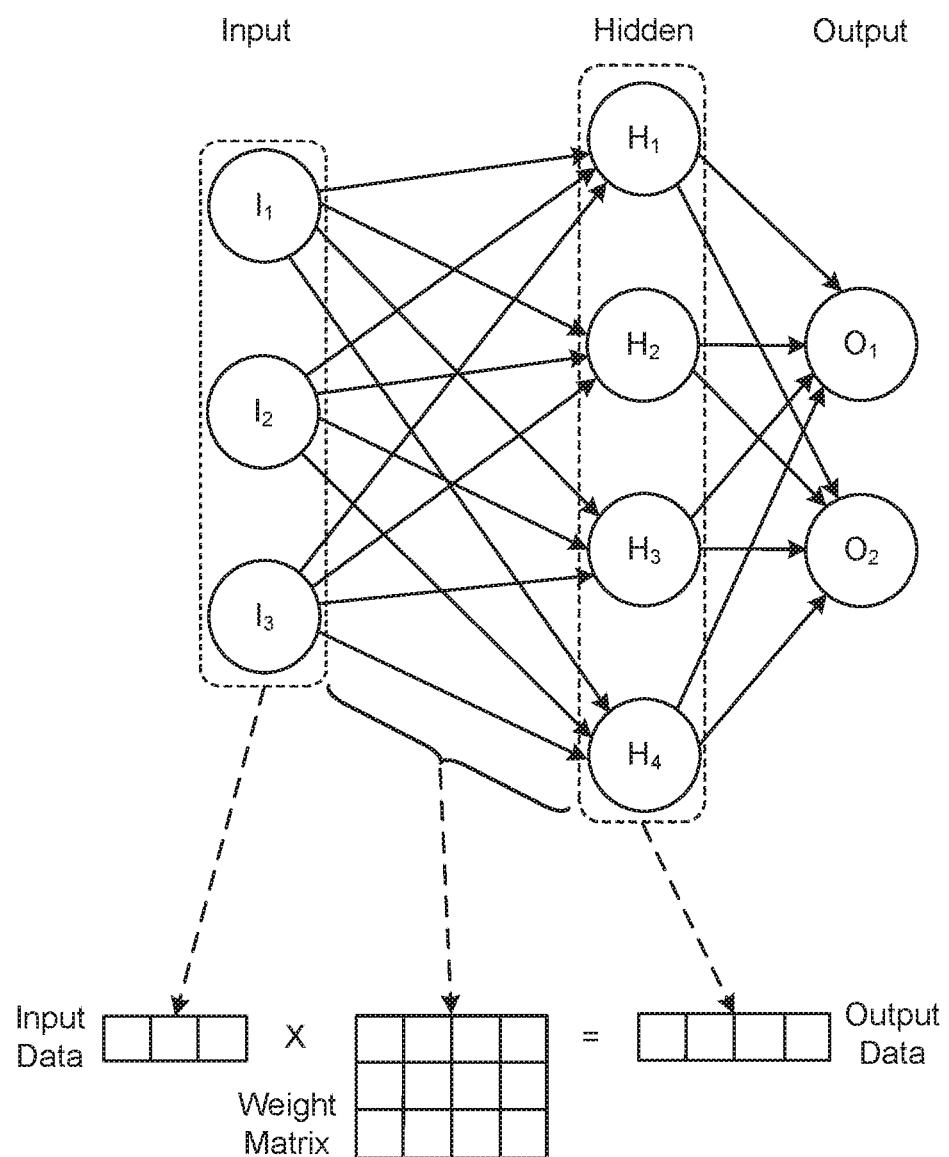
FIG. 8 is a schematic representation of the use of matrix multiplication in a neural network.

FIG. 8 is a schematic representation of the use of matrix multiplication in a neural network. Matrix multiplication, or MatMul, is a commonly used approach in both the training and inference phases for neural networks and is used in kernel methods for machine learning. FIG. 8 at top is similar to FIG. 6, where only a single hidden layer is shown between the input layer and the output layer. The input data is represented as a vector of a length corresponding to the number of input nodes. The weights are represented in a weight matrix, where the number of columns corresponds to the number of the number of intermediate nodes in the hidden layer and the number of rows corresponds to the number of input nodes. The output is determined by a matrix multiplication of the input vector and the weight matrix, where each element of the output vector is a dot product of the vector of the input data with a column of the weight matrix.

A common technique for executing the matrix multiplications is by use of a multiplier-accumulator (MAC, or MAC unit). However, this has a number of issues. Referring back to FIG. 7B, the inference phase loads the neural network weights at step 722 before the matrix multiplications are performed by the propagation at step 723. However, as the amount of data involved can be extremely large, use of a multiplier-accumulator for inferencing has several issues related to loading of weights. One of these is high energy dissipation due to having to use large MAC arrays with the required bit-width. Another is high energy dissipation due to the limited size of MAC arrays, resulting in high data movement between logic and memory and an energy dissipation that can be much higher than used in the logic computations themselves.

To help avoid these limitations, the use of a multiplier-accumulator array can be replaced with other memory technologies. For example, the matrix multiplication can be computed within a memory array by leveraging the characteristics of Storage Class Memory (SCM), such as those based on ReRAM, PCM, or MRAM based memory cells. This allows for the neural network inputs to be provided via read commands and the neural weights to be preloaded for inferencing. By use of in-memory computing, this can remove the need for logic to perform the matrix multiplication in the MAC array and the need to move data between the memory and the MAC array.

The following considers embodiments based on memory arrays using NAND type of architectures, such as flash NAND memory using memory cells with a charge storage region. Flash NAND memory can be implemented using both multi-level cell (MLC) structures and single-level cell (SLC) structures, where the following mainly considers embodiments based on SLC Flash memory. In contrast to MAC array logic, use of SLC Flash memory shows several advantages, including a much higher area/bit value, a much higher throughput rate, and a significant reduction in energy dissipation due to minimizing data movement by performing in-array multiplication. Additionally, the NAND flash structure is highly scalable, supporting deep and wide neural networks.

A technique that can be used to reduce the computational complexity of the inference process is by use of a Binarized Neural Network (BNN), in which a neural network works with binary weights and activations. A BNN (also called an XNOR-Net) computes the matrix-vector multiplication with "binary" inputs $\{-1, 1\}$ and "binary" weights $\{-1, 1\}$. FIG. 9 is a table illustrating the output of a binary neural network in response to the different input-weight combinations. As shown in the right-most column, when the input and weight match, the output is 1; and when the input and the weight differ, the output is −1. FIGS. 10-13 illustrate an embodiment for the realization of a neural network with binary-input and binary-weights in an SLC NAND array.

FIG. 10 illustrates an embodiment for a unit synapse cell for storing a binary weight in a pair of series connected memory cells FG1 and FG2. In this example, each of the memory cells are SLC cells storing one of two states and can be part of a larger NAND string. The memory cells FG1 and FG2 can be flash memory cells and are programmed or erased by respectively adding or removing electrons from a charge storing layer or a floating gate, and are sensed by applying corresponding voltages V1 and V2 to their control gates. When the memory cells FG1 and FG2 are part of a larger NAND string that includes additional unit synapse cells or other memory cells, the pair of memory cells can be adjacent on the NAND string or separated by other memory cells forming the NAND string. In the following discussion, the individual memory cells of a unit synapse cell will be represented as being adjacent, but other arrangement are possible depending on the embodiment. For example, the upper half of a NAND string could hold the first memory cell of each unit synapse, with the second memory cell of each unit synapse in the lower half of the NAND string. For any of these arrangements, when sensing a given unit synapse, the other memory cells and select gates on the same NAND string will be biased such that both of the memory cells of the non-selected unit synapses and any other memory cells, along with the select gates, are conducting.

FIG. 11 illustrates the distribution of threshold voltages for the storage of data states on an SLC memory. In this embodiment, the erased negative threshold state is taken as the "1" state and the positive threshold state is taken as the "0". FIG. 10 illustrates a typically distribution of the threshold voltage of the memory cells of a set of memory cells, such as an erase block or whole array, after the memory cells have been erased (here assigned the "1" state) and the memory cells to programmed to the positive threshold states (here assigned the "0" state). As discussed further with respect to FIGS. 12 and 13, a binary weight will have one memory cell of a unit synapse in the "0" state and the other memory cell in the "1" state. More generally, the "1" state need not be a negative threshold state as long as the two states correspond to a lower threshold state, here defined as the "1' state, and a higher threshold state, here defined as the "0" state.

For sensing the memory cells with the threshold distribution illustrated in FIG. 11, a first voltage level Vread is used to distinguish between the data states, so that if applied to the control gate of a memory cell, the memory cell will conduct if in the "1" state and not conduct if in the "0" state. For example, if the "1" states are a negative threshold voltage state and the "0" states are a positive threshold voltage state, Vread could be taken as 0V. A second sensing voltage Vpass is high enough such that a memory cell in either state will conduct. For example, Vpass could be a few volts. In the following, Vread will be defined as the "0" input voltage value and Vpass will be defined as the "1" input voltage value.

In implementations of NAND flash memory, a number of different voltage levels are often used for sensing operations, both in program verify and read operations, for both SLC and MLC memory. For example, a program verify level for a given data state may be offset from the read voltage level for the same data state. Also, various levels may be used for pass voltages in different operations and conditions to place a memory cell in a conducting state independently of its stored data state. To simply the following discussion, only the single Vread voltage will be used to differentiate between the data states and only the single Vpass voltage will be used when a memory cell or select gate is to be put into a conducting state for all stored data state values.

Figure 12:
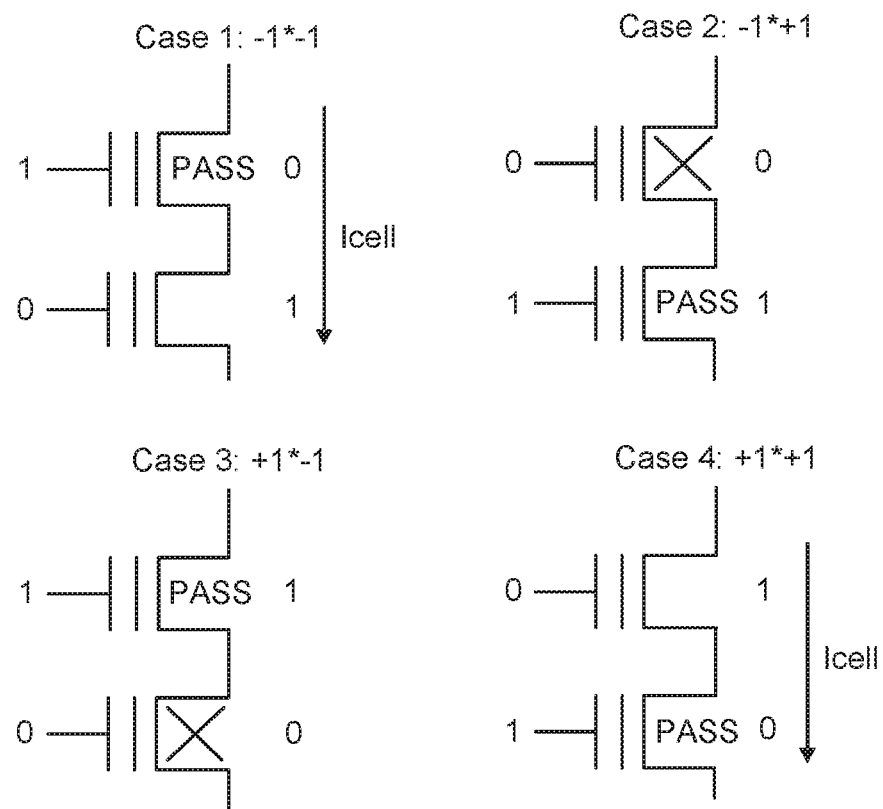

FIGS. 12 and 13 illustrate an embodiment for implementing a binary neural network using a pair of series connected SLC memory cells as a unit synapse. More specifically, FIG. 13 shows one embodiment for the correspondence between input logic, weight logic, and output logic of FIG. 9 and the input voltage patterns, threshold voltage Vth of the unit synapse's memory cells, and the output voltage, respectively. FIG. 12 is a schematic representation of the response of a unit synapse to the different cases.

In FIGS. 12 and 13, a logic input of −1 corresponds to the input voltage pattern of V1=Vpass="1", V2=Vread="0"; and a logic input of +1 corresponds to the input voltage pattern of V1=Vread="0", V2=Vpass="1". A weight logic of −1 corresponds to the memory cell FG1 being in the "0" (programmed) state and FG2 being in the "1" (erased state); and a weight logic of +1 corresponds to the memory cell FG1 being in the "1" state and FG2 being in the "0". An output logic of +1 corresponds to the unit synapse conducting a current Icell, resulting in an output voltage drop of ΔV across the unit synapse; and an output logic of −1 corresponds to the unit synapse not conducting, resulting in little or no output voltage drop across the unit synapse.

FIG. 12 schematically represents the four cases of input, weight pairs. In case 1, the input and weight both match with values of −1. The applied input voltage pattern applies the higher input voltage of Vpass, or "1", to upper cell with the higher Vth "0" data state and the lower input voltage of Vread, or "0", to the lower cell with the lower Vth "1" data state, so that cells are conductive and pass a current of I cell. In case 2, the input voltage pattern is reversed with respect to case 1, with the input logic is now at +1 while the weight is at −1. This results in the lower Vpass, or "0", voltage level applied to the top cell in higher Vth, which consequently will not be conductive (as indicated by the X under the memory cell) and no appreciable current will flow thought the pair.

For cases 3 and 4 on the bottom of FIG. 12, the weight value is now +1, with the lower Vth "1" state in the upper cell and the upper Vth "0" programmed in to the lower cell. In case 3, the −1 input voltage pattern is applied to the unit synapse, resulting the lower cell not conducting as it receives the lower Vread, or "0", voltage level. In case 4, the higher Vpass, or "1" input is now applied to the lower memory cell, which consequently conducts, and the unit synapse passes the current Icell.

As represented in the embodiment of FIGS. 12 and 13, the use of a pair of series connected memory cells of FIG. 10 as a unit synapse can be used to implement the binary neural network logic table of FIG. 9. The unit synapses can be incorporated into larger NAND strings of multiple such series connected unit synapses. When sensing a selected unit synapse on a NAND string, other unit synapses on the same NAND string can be biased to be on by using a Vpass voltage, with the NAND stings select gates also biased to be on.

The use of NAND flash memory to store weight and compute the dot products of inputs and weights in-array can be used in both the training and inference phases. The training phase can proceed as in the flow of FIG. 7A, where step 709 would erase and reprogram the weights as needed to adjust the weights until determined to be sufficiently accurate at step 707. The present discussion will mostly focus on the inference phase, where the weights have previously been determined in a training process and then loaded into a NAND memory by programming of the unit synapses to the determined binary weight values.

Figure 14:
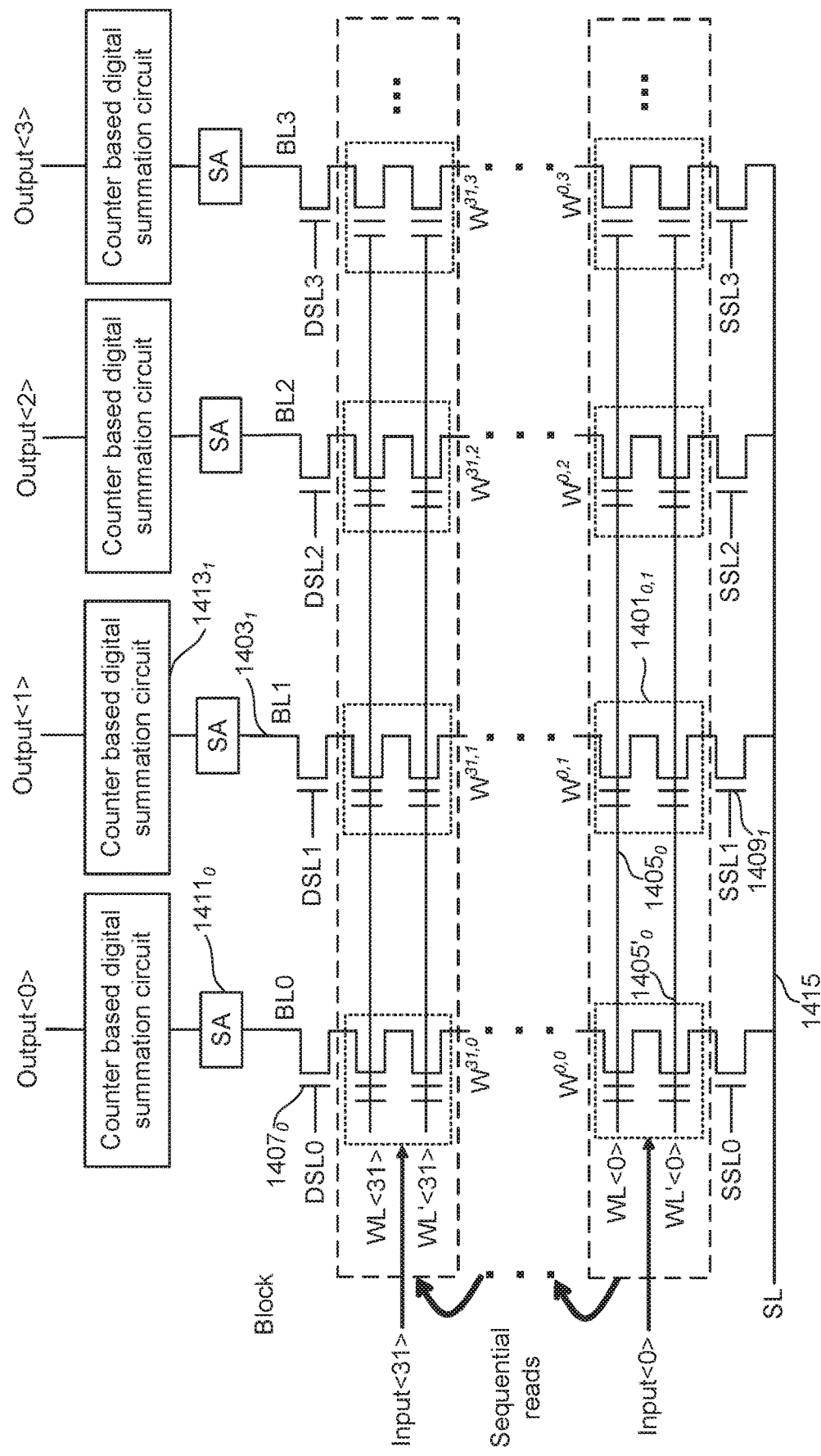
FIG. 14 illustrates the incorporation of the unit synapses into a NAND array.

FIG. 14 illustrates the incorporation of the unit synapses into a NAND array, such as in the memory structure 326 of FIG. 5. FIG. 14 shows one block of what can be a larger array of many blocks, each with multiple NAND strings connected between a source line 1415 and a corresponding bit line BLi 1403$i$. A typical NAND memory array will be formed of many such memory blocks. Each NAND string is formed of a number of series memory cells connected in series between a source side select gate SSLi 1409$i$, by which the NAND string is connected to the source line 1415, and a drain side select gate DSLi 1407$i$, by which the NAND string is connect to the corresponding bit line BLi 1403$i$.

The memory cells along each NAND string are paired into unit synapses of a pair of memory cells storing a weight $W^{i,j}$, as illustrated by the unit synapse of FIG. 10. Each of the NAND strings can have one or more unit synapse connected in series, where the embodiment of FIG. 14 illustrates 32 unit synapses per NAND string. Each unit synapse can store a binary weight and is connected along a pair of word lines WL<j> 1405$j$ and WL'<j> 1405'$j$ that receive a corresponding logic input Input<j> corresponding to the voltages of FIG. 13. The word line pairs WL<j> 1405$j$ and WL'<j> 1405'$j$ span the columns of NAND strings of the block. In the embodiment of FIG. 14, the memory cells of a unit synapse are adjacent on the NAND string, but other arrangements can be used such that the memory cells of the synapses are interleaved rather than being contiguous; and although the discussion here is focused on binary weights using two SLC memory cells per synapse, other embodiments can use more memory cells per unit synapse, multi-level memory cells, or both, to store neural network weights with more than the two values of the binary example. Additionally, although the NAND strings in the shown embodiment are formed of charge storing, flash memory cells, other memory cells with the same array architecture can also be used.

The determination of the output of a unit synapse 1401$i,j$ storing weight $W^{i,j}$ can be determined by applying an input logic voltage pattern to the corresponding input to Input<j>, while the other memory cells and select gates of the selected NAND string are biased to be ON. Based on the input logic and weight logic, the unit synapse storing 1401$i,j$ weight $W^{i,j}$ will either conduct or not, as represented in the table of FIG. 15, which can be determined by the corresponding sense amplifier SAi 1411$i$. As discussed further below, for each bit line a corresponding counter-based digital summation circuit CSCi 1413$i$ can keep track of how many of the unit synapses along the bit line conduct in response to the inputs, summing these values, where the sense amplifiers and summation circuits can be part of the Sense Blocks 350 of FIG. 5. The same input Input<j> is applied concurrently to all of the unit synapses 1401$i,j$ storing weight $W^{i,j}$ for all of the bit lines BLi 1403$i$ biasing the select gates of the corresponding select gates SSLi 1409$i$ and DSLi 1407$i$. Consequently, the same input can be applied to multiple synapses concurrently. The different synapses along the NAND strings can selected sequentially for sensing, with the results along each bit line BLi 1403$i$ being accumulated by CSCi 1413$i$. In a NAND memory, a page is the unit of read and program, where the read page and program page are usually taken to be the same, such as the whole of the memory cells connected along a word line or some portion of the memory cells along a common word line. For programming, the data of the unit synapses along a single word line would still be programmed word line by word line; however, relative to a standard NAND memory operation, where the goal to determine the data content of the individual memory cells, the reading of a page of the binary weight unit synapses is performed in word line pairs such that the read page in this case can be taken as corresponding to a word line pair.

Referring back to FIG. 8, matrix multiplication is a multiple sum-of product (dot-product) calculation for input-weight vector pairs (row-column of input matrixes) used for inferencing in a neural network. FIGS. 15 and 16 consider an example of the computation of a dot-product for the binary neural network algebra and how to implement this using a counter based summation digital circuit for an SLC NAND BNN embodiment. More specifically, although a binary neural network based on the logic illustrated by the table of FIG. 8 is based on the weights, inputs, and outputs as having the values of either +1 or −1, when implemented by a NAND array as illustrate by FIG. 14, a sense amplifier will either register as conducting ("1") or not conducting ("0"). Consequently, for the counter-based digital summation circuits CSCi 1413$i$ to accumulate the results to compute the dot-product of the matrix multiplication requires a conversion of the (+1, −1) based values to a (1,0) basis, where the −1 values are replaced by 0.

The table of FIG. 15 considers the dot product of the example of an 8 element binary neural network input vector $I^{bnn}$ across the top row and an 8 element binary neural network weight vector $W^{bnn}$ in the second row when the vector elements are all quantized to −1/+1. The third row illustrates the element by element product of $I^{bnn}$ and $W^{bnn}$, equaling +1 when the two match and −1 when these differ. The dot product is then based on summing these bit by bit products to generate the dot-product $P^{bnn\_dec}$ of the two vectors. In decimal system, the final correct result of adding up these values is calculated as $P^{bnn\_dec}=2$.

On the top two rows of the table of FIG. 16, the input vector $I^{bnn}$ and weight vector $W^{bnn}$ are converted into the 1/0 binary basis for the same vectors as in FIG. 15. The third row of FIG. 16 illustrates the corresponding sense amplifier output, being the bit by bit XNOR value of the two vectors, which is 1 when the values match and 0 when the values differ. By accumulating these values from the sense amplifiers SAi 1411$i$ in the corresponding summation circuits CSCi 1413$i$ to determine their sum, this produces a popcount $CNT^{bnn\_out}$ corresponding to the number 1 values. In the example of FIG. 16, $CNT^{bnn\_out}=5$, which differs from the $P^{bnn\_dec}=2$ value of FIG. 15 as the result of a mismatch in the input and weight is now a 0 rather than a −1.

To correct for this and determine $P^{bnn\_dec}$ in the binary system, a substitution of the output of popcount operand $CNT^{bnn\_out}$ into Eq. 1 can be used to obtain a derived $P^{bnn\_dec}$:

$$P^{bnn\_dec}=2*CNT^{bnn\_out}-S, \quad (Eq.\ 1)$$

where S is the size of vector. In this example S=8, so that $P^{bnn\_dec}=2*5-8=2$, which is the exact $P^{bnn\_dec}=2$ for the dot-product of FIG. 15.

Figure 17:
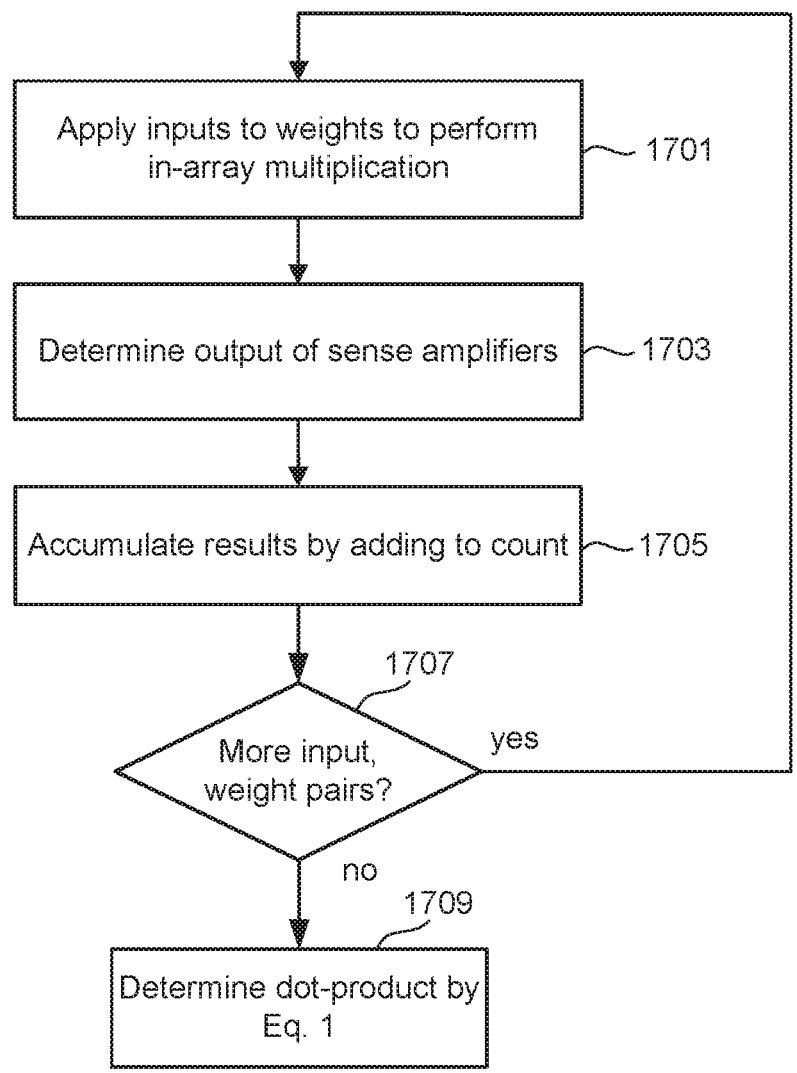
FIG. 17 is a flowchart for one embodiment of a dot-product calculation using a binary neural network in inference.

FIG. 17 is a flowchart for one embodiment of a dot-product calculation using a binary neural network in inference, as illustrated in FIGS. 15 and 16. At step 1701, a first input value is applied to a weight of a first unit synapse to perform an in-array multiplication. Referring back to FIG. 14, this corresponds to applying an Input<j> value to a corresponding selected unit synapse 1401$^{i,j}$ storing weight $W^{i,j}$ on a bit line BLi 1403$i$, for example Input<0> applied to the bottom-most unit synapse on BL0. At step 1703, the corresponding sense amplifier SAi 1411$i$ determines whether the NAND string is conducting (1) or not (0), corresponding to an XNOR-ing of the input and weight values. Step 1705 performs the accumulation, with the sensing result added to a $CNT^{bnn\_out}$ value maintained by the counter CSCi 1413$i$. At step 1707, it is determined if there are more input/weight pairs to contribute to the dot-product, corresponding to another input/weight pair for the NAND (or for other NAND strings on other blocks connected along the bit line) and, if so, loops back to step 1701. If all the input/weight pairs have been computed and summed for the $CNT^{bnn)\_out}$ of the dot product, the flow move on to step 1709 to convert the popcount $CNT^{bnn\_out}$ value to the dot-product $P^{bnn\_dec}$ by use of Eq. 1. In the example of the tables of FIGS. 15 and 16, the S value for Eq. 1 would be 8, while for an entire NAND string as illustrated in FIG. 14 S=32. Note that the NAND array structure of FIG. 14 allows for the computation of a dot-product according to the flow of FIG. 17 to be performed concurrently along each bit line.

Figure 18:
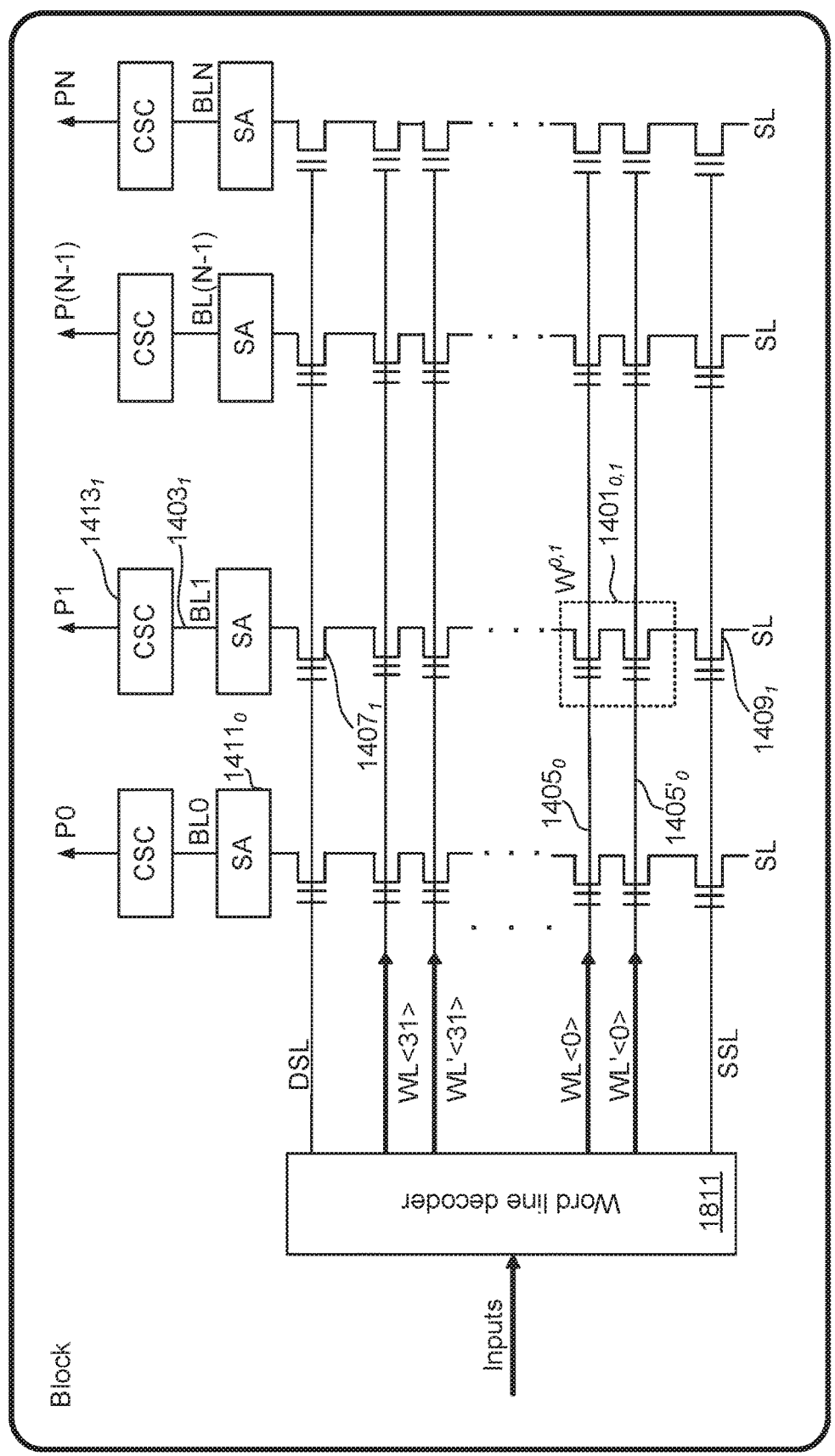
FIG. 18 illustrates an embodiment of a summation circuit for an SLC NAND array to support binary neural networks.

FIG. 18 illustrates an embodiment of summation circuit for an SLC NAND array to support binary neural networks. More specifically, FIG. 18 repeats many of the elements of FIG. 16 in a somewhat simplified form, but also shows a word line decoder block 1811. The word line decoder 1811 received the inputs, either a −1 or +1 input for a selected unit synapse, which are then translated into the corresponding voltage pattern for the word line pairs WL<j>, WL'<j> and applied to the selected unit synapse one of the word line pairs (those of the selected unit synapse). For non-selected unit synapses on the NAND string and for the select gates, the word lines and select lines will be set to be on, such as at the voltage level of Vpass. Based on these inputs, the counter-based summation digital circuits CSCi 1413i of each of the bit lines can increase the count based on the output of the sense amplifier SAi 1411i in the accumulation process.

Figure 19:
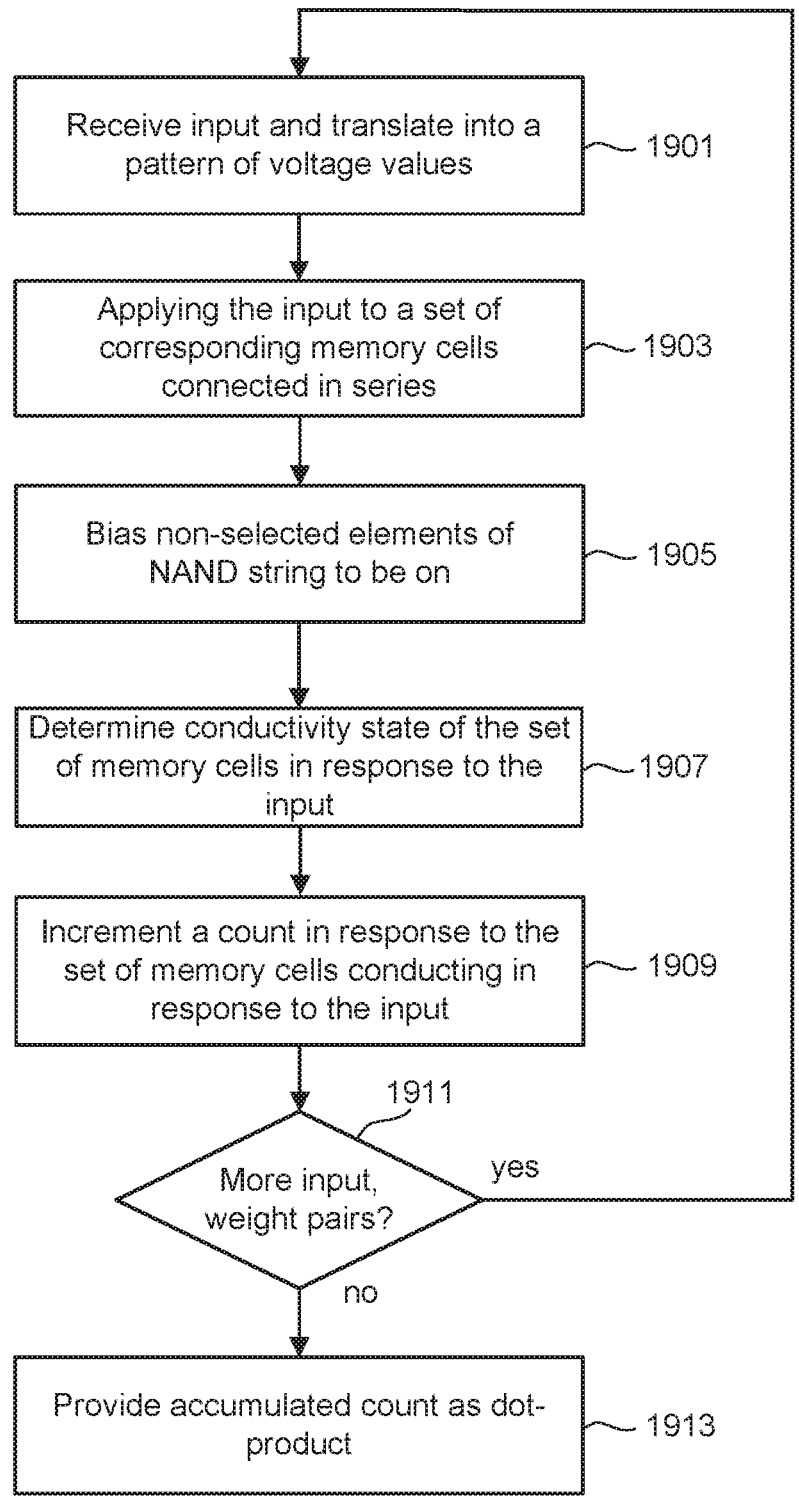
FIG. 19 is a flowchart for one embodiment of a dot-product calculation using a ternary-binary neural network in inference, as illustrated in the tables of FIGS. 15 and 16 and array architecture 18.

FIG. 19 is a flowchart for one embodiment of a dot-product calculation using a binary neural network in inference, as illustrated in the tables of FIGS. 15 and 16 and array architecture of FIG. 18. Beginning at step 1901, and referring FIG. 18, the memory array receives an input Input<j> of and translates this into a set of voltage values, corresponding to a −1 or +1 input value; and at step 1903 applies the voltage level to a word line pair WL<j>, WL'<j> 1405j, 1405'j. As the word lines span the NAND string of the selected block, the process of FIG. 19 can be performed concurrently for any of the NAND strings for the unit synapses connected along the word line pair WL<j>, WL'<j> 1405j, 1405'j. Additionally, in the NAND structure, the other elements of a selected NAND string (SSLi 1409i, DSLi 1407i, and the non-selected memory cells of the NAND string) will be biased to be on, such as applying Vpass, at step 1905. Although listed as an ordered set of separate steps in FIG. 19, steps 1903 and 1905 are typically performed concurrently by the word line decoder 1811.

Step 1907 determines the conductivity of set of memory cells of the selected unit synapse. As illustrated in the table of FIG. 15, the conductivity of the NAND string corresponds to the output logic value of the unit synapse in response to the input and can be determined by the sense amplifier SAi 1411i. Based on the conductivity state of the unit synapse, at step 1909 the value of count of the corresponding CSCi 1413i is either incremented or not as discussed above with respect Eq. 1 and the table of FIG. 16.

Step 1911 determines if there are more input, weight pairs to add to the dot-product and, if so, the flow loops back to step 1901. Once the contributions of all of the input, weight pairs to the dot products have been determined, the dot product can be provided at step 1913. The set of dot-products determined at step 1913 can then serve as the input to a subsequent neural network layer or be the output of inference process.

Figure 21:
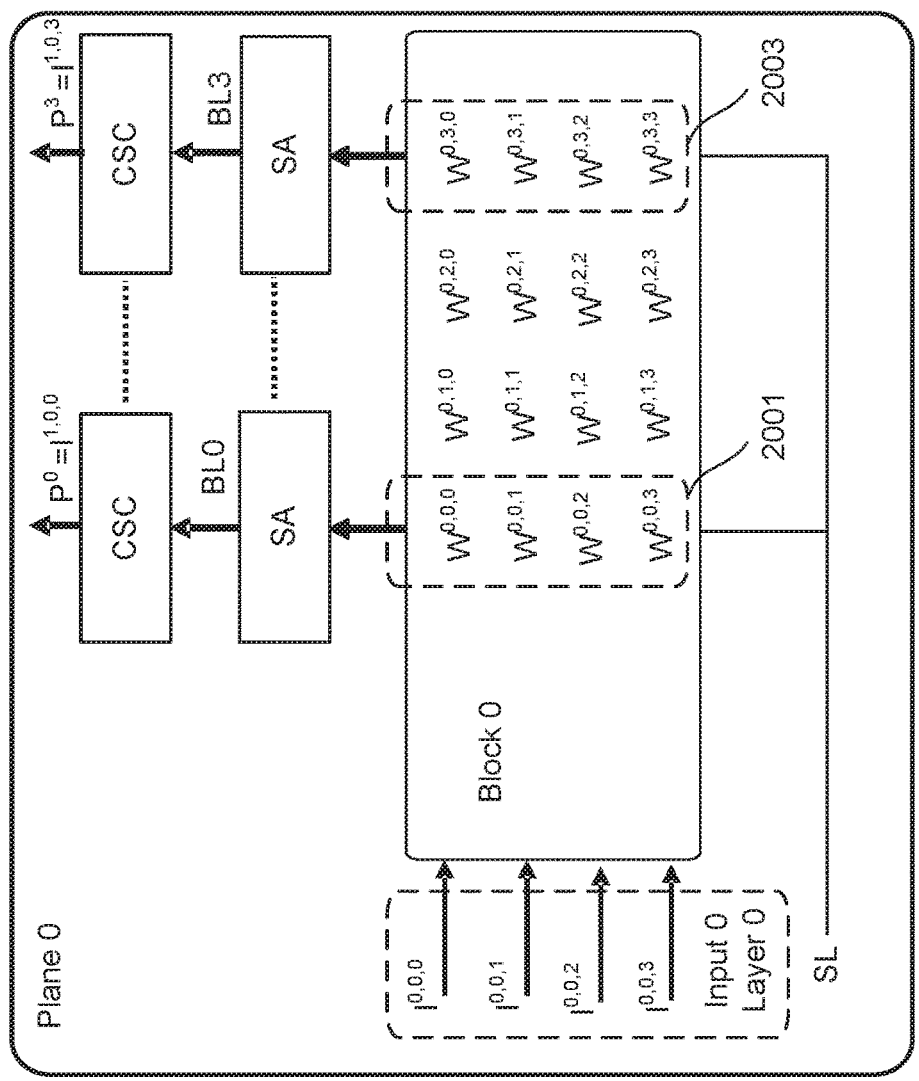
FIGS. 20 and 21 illustrate an example of a neural network and its implementation through a NAND array.
Figure 20:
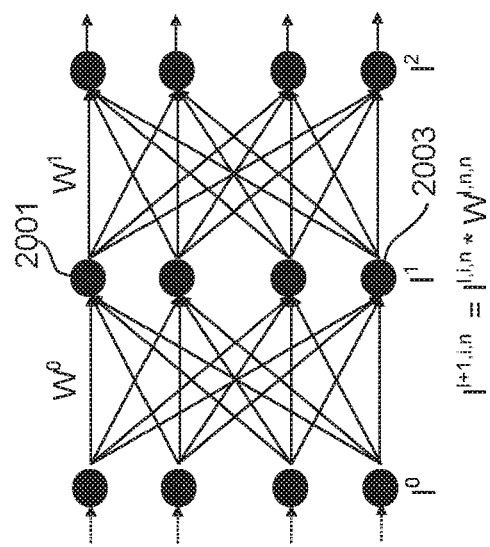

FIGS. 20 and 21 illustrate an example of a neural network and its implementation through a NAND array. In the process described above with respect to FIG. 19, the response to an input of one unit synapse along each bit line is determined based on whether the corresponding sense amplifier determines the unit synapse to conduct or not. For a given block, the contribution of each of the synapses along a NAND string is determined sequentially by the sense amplifiers.

FIG. 20 illustrates an example of three fully connected layers of four nodes each, so that the weight matrix between the layer is a 4×4 matrix. In FIG. 20, the inputs at the nodes are labelled as $I^{l,\,i,\,n}$, where 1 is the layer index, i is the input index, and n is the neuron index. In the example of FIG. 20, three layers are shown, l=(0,1,2), and each has four nodes, n=(0,1,2,3). (The input index is used in some of the following examples of increased parallelism.) The weight matrices $W^{l,\,n,\,n}$ connecting the layers are then 4×4 where the matrix multiplication to form the dot-products from the inputs of one layer to the next is:

$$I^{l+1,i,n} = I^{l,i,n} * W^{l,n,n}.$$

The inputs of one layer are applied as voltage patterns on the word line pairs to the unit synapses to generate dot product values that are the inputs of the next layer.

FIG. 21 is schematic representation of how these weight matrices are stored in the unit synapses of a NAND array for the in-array computations of matrix multiplication. Relative to FIG. 18, the block (here labelled Block 0) is represented in terms of the weights stored in the unit synapses, rather than the corresponding memory cell pairs, the voltage level input patterns are represented as a single input, rather than the voltage levels applied to the corresponding word line pairs. The weight matrix between a pair of layers is then stored in a number of unit synapses along a number of NAND strings, where the number of unit synapses per NAND string and the number of NAND strings corresponds to the size of the weight matrix. In this example of 4×4 weight matrices, this corresponds to 4 unit synapses along 4 NAND strings. As represented in FIG. 21 these are 4 adjacent unit synapses on 4 adjacent bit lines, but these can be distribution across the block differently depending on the embodiment.

Relative to the representation of FIG. 20, a weight matrix is stored on the NAND array in a transposed form. For example, the weights from the different inputs of first layer of FIG. 20 into the top node 2001 of the second layer are stored along the first NAND string connected to BL0; and the weights into the bottom node 2003 are stored along the fourth NAND string connected to BL3. To illustrate the correspondence, the reference numbers 2001 and 2003 are also used in FIG. 21 to illustrate the placement of the corresponding weights into these nodes.

To compute the different dot-products of the matrix multiplication, the data inputs are provided in a sequence of read commands. To compute the output of single layer, the pages of weights are then read sequentially by the sense amplifiers over, in this example, four cycles:

cycle 1: achieve $I^{0,0,0} * W^{0,0,0}$
cycle 2: achieve $I^{0,0,1} * W^{0,0,1}$
cycle 3: achieve $I^{0,0,2} * W^{0,0,2}$
cycle 4: achieve $I^{0,0,3} * W^{0,0,3}$, where each of the cycles corresponds to a loop in the flow of FIG. 19 and different sensing orders can be used in different embodiments. The results of the cycles are sensed by the sense amplifier SA on each of the bit lines and accumulated in the CSCs, where the latency of the accumulation process is hidden under the concurrent multiply operations for the following cycles read. The output $P''$ from each bit line will then be the inputs $I^{l+1,\,i,\,n}$ of the next layer.

Figure 22:
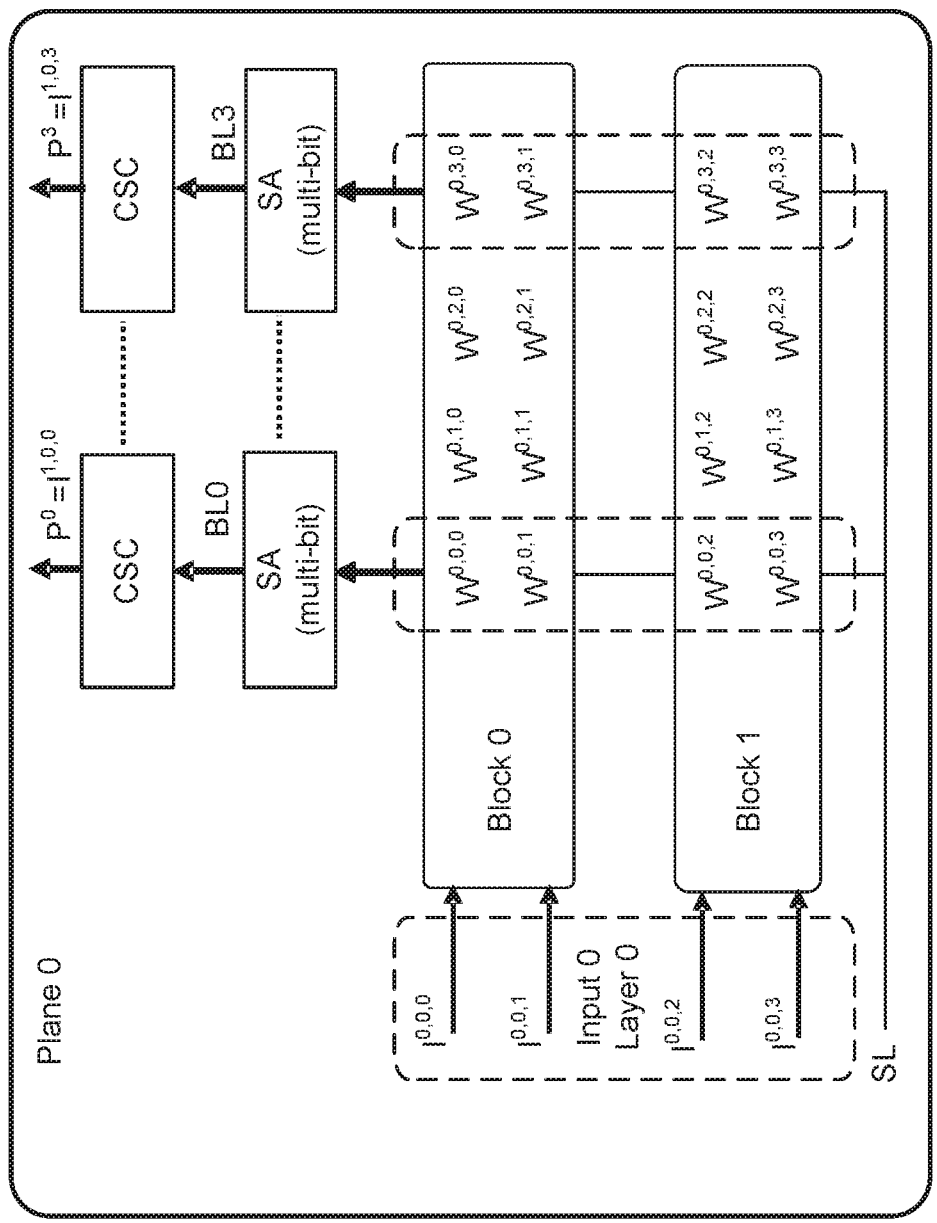
FIG. 22 illustrates an example of a neural network and its implementation through a NAND array to achieve a high parallelism across NAND blocks by leveraging multiple blocks within a single plane.

FIG. 22 illustrates an example of a neural network and its implementation through a NAND array to achieve a high parallelism across NAND blocks by leveraging multiple blocks within a single plane. In the process described above with respect to FIGS. 19 and 21, the response to an input of one unit synapse along each bit line is determined based on whether the corresponding sense amplifier determines the unit synapse to conduct or not. FIG. 22 considers an embodiment using a multi-bit sense amplifier, such as one that can distinguish between different current level, allowing multiple blocks within a single plane to be sensed concurrently.

In a standard read operation where the object is to determine the data state stored in a memory cell, the determination is made by a sense amplifier based on a current or voltage level along on a bit line based on whether or not the selected memory cell conducts. If multiple cells along a common bit line were sensed at the same time, where some conduct and some do not conduct, it would not be possible to determine which of the individual memory were the conducting cells memory cells and establish their corresponding data states. For the counter's output $P''$ from the matrix multiplication, however, it is only the sum of the number of unit synapses that conduct in response to the inputs that is of concern, not which of the individual synapses contribute. Consequently, the response of multiple unit synapses on different blocks in response to a corresponding set of inputs can be determined concurrently, thereby increasing parallelism, if the sense amplifier is able to determine the number of conducting synapses. By incorporating multi-sense amplifiers, the embodiment of FIG. 22 lets multiple unit synapses along a common bit line from differing block to be sensed in parallel.

FIG. 22 is arranged similarly to FIG. 21 and is again shown storing the same 4×4 weight matrix connecting the first two layers of FIG. 20. FIG. 22 differs FIG. 21 in that the weights are now distributed between two different blocks, here labelled Block 0 and Block 1, but these could be any two blocks of the same plane and the discussion can be extended to more than two blocks to further increase parallelism. As discussed above with respect to FIGS. 20 and 21, the weight matrix is again stored in a transposed form.

To perform a matrix multiplication, data inputs are provided in a sequence of read commands, but to compute the output of single layer, multiple blocks are now read in parallel (one page of unit synapses per block). In the example of FIG. 22 for the matrices of FIG. 20, where two blocks are activated concurrently, an output of a layer can be computed within a 2-cycle latency:

cycle 1: achieve $I^{0,0,0}*W^{0,0,0}+I^{0,0,2}*W^{0,0,2}$
cycle 2: achieve $I^{0,0,1}*W^{0,0,1}+I^{0,0,3}*W^{0,0,3}$ where cycle 2 is accumulated while the output is calculated for cycle 1, so that the accumulation latency is hidden under concurrent multiply operations.

Figure 23:
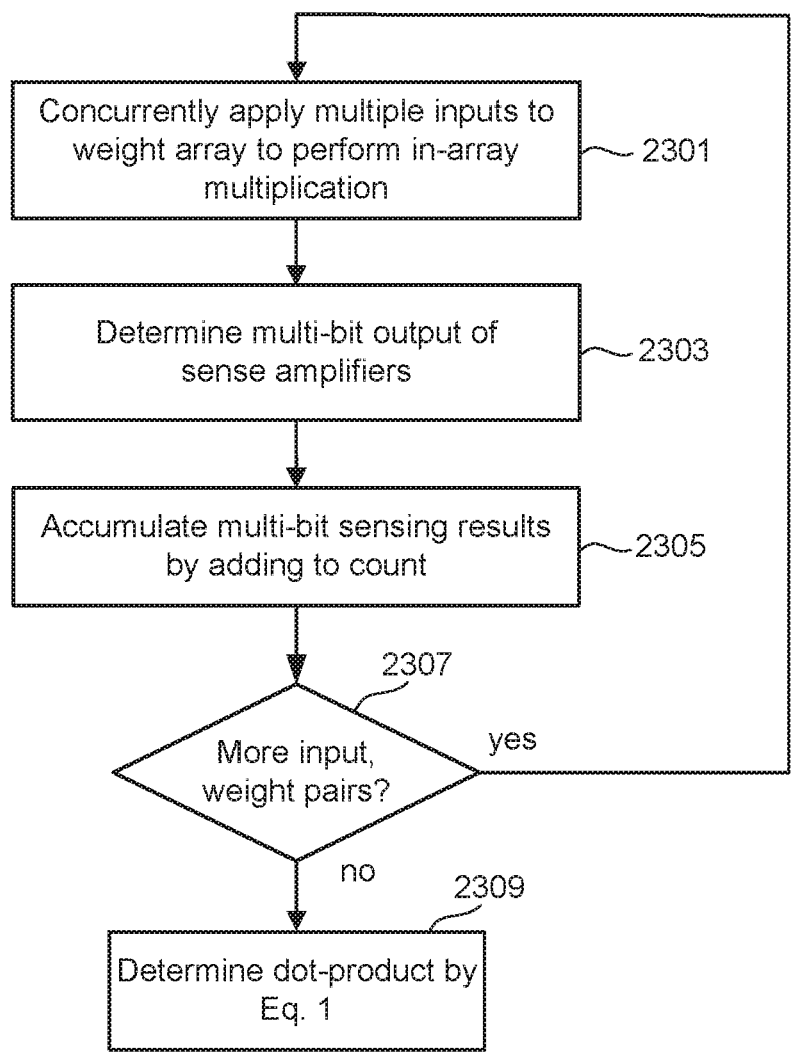
FIG. 23 is a flowchart for one embodiment of a dot-product calculation similarly to FIG. 17, but that incorporates the multi-block parallelism illustrated by FIG. 27.

FIG. 23 is a flowchart for one embodiment of a dot-product calculation similarly to FIG. 17, but that incorporates the multi-block parallelism illustrated by FIG. 22. Relative to step 1701, the parallel sensing of multiple blocks at step 2301 can now concurrently apply multiple inputs concurrently in each loop. At step 2303, the output of the sense amplifier is now a multi-bit value, rather than the binary value of step 1703, and corresponds to the number of conducting unit synapses along a bit line. The multi-bit value is then accumulated at step 2305, with the steps 2305, 2307, and 2309 corresponding to steps 1705, 1707, and 1709 of FIG. 17.

To further increase parallelism, the number of blocks sensed concurrently can be increased beyond the two shown in the example of FIG. 22 up to the total number of inputs for layer. The degree of parallelism can be based on considerations including the amount of the resultant current that would be drawn and the level of resolution that can reasonably achieved by the multi-bit sense amplifiers from the available current window.

Figure 24:
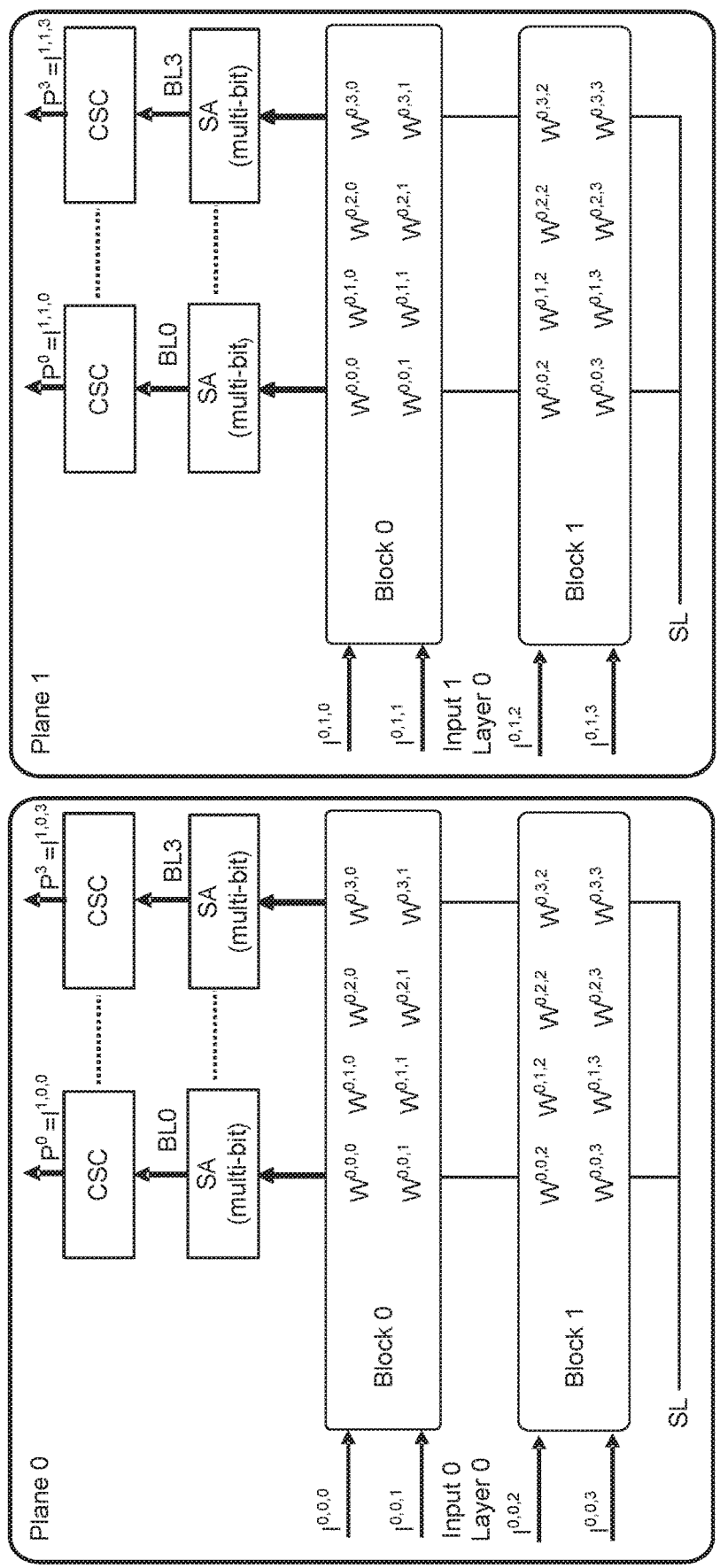
FIG. 24 illustrates additional embodiments that can inference for the inputs of a neural network concurrently across multiple planes.

FIG. 24 illustrates additional embodiments that can further increase parallelism by using an architecture that can inference for the inputs of a neural network concurrently across multiple planes. The multiple plane implementation can be used for sensing a single block at a time within each plane (as in FIG. 21) or for multiple blocks at a time within each plane (as in FIG. 22). The example of FIG. 24 is again based on the example of the network of FIG. 20 and uses two planes and two blocks within each plane, although both the number of planes and blocks can be extended.

FIG. 24 shows two planes, Plane 0 and Plane 1, for an embodiment where two blocks per plane are sensed concurrently, where the planes can be on a common die or on different die. For both of Plane 0 and Plane 1, the weights are stored as in FIG. 22 and the other elements are also repeated from FIG. 22. Where the planes differ is that input index for the two planes differ, with inputs $I^{0,0,n}$ for Plane 0 and the subsequent set of inputs to the layer of $I^{0,1,n}$ for Plane 1.

In block-level parallelism, the memory can use multiple blocks of single plane to compute one output of a single layer, where the read commands can be issued in parallel to access multiple blocks as described with respect to the FIG. 22, with one page (of unit synapses) accessed per block in a cycle. By adding the plane-level parallelism of FIG. 24, multiple planes can be used to compute multiple outputs of a single layer by using the same weight matrix is stored in both planes and where data can be provided to both planes in parallel. In the embodiment of FIG. 24, using 2 planes with 2 blocks/plane in parallel, the two outputs of a single layer can be computed within a 2-cycle latency, where the accumulation latency is hidden under multiplication (read command).

Parallelism can also be increased through use of plane pipelining, where the output of one plane (corresponding to the matrix multiplication between one set of nodes) can be used as the input of another plane (corresponding to the matrix multiplication between the next set of nodes). Plane pipelining can further be combined block level parallelism, plane level parallelism, or both to achieve even greater levels of parallelism.

Figure 25:
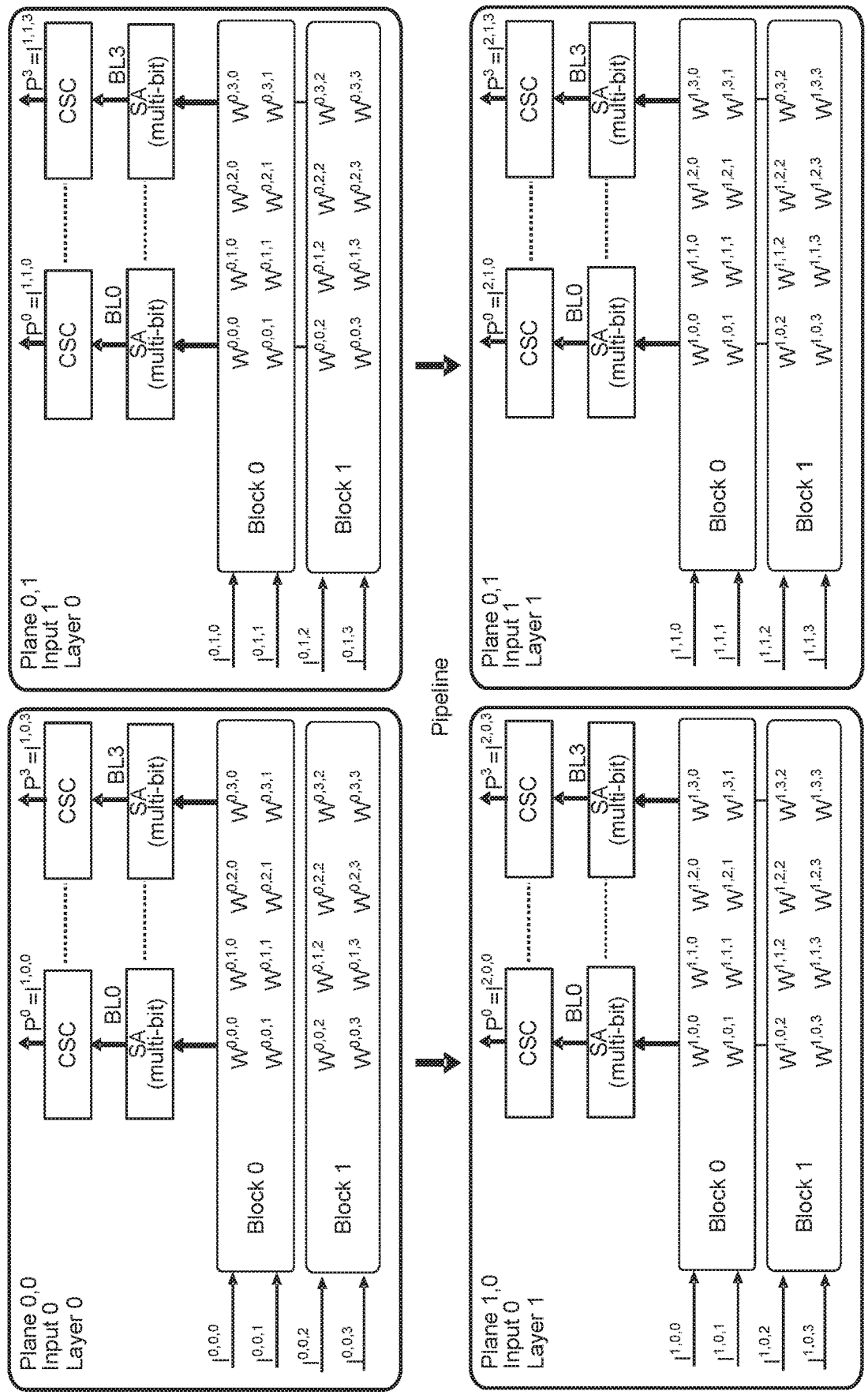
FIG. 25 illustrates an embodiment of plane pipelining for different neural network layers.

FIG. 25 illustrates an embodiment of plane pipelining for different neural network layers. Referring back to the example of FIG. 20, the first stage in the pipeline stores the weight matrix between layers 0 and 1, and next stage stores the weight matrix connected layers 1 and 2. The example of FIG. 25 is for two stages, and also includes 2-plane parallelism and 2-block parallelism, but these are each independent aspects and more pipeline stages can be similarly incorporated and the degree of both plane block level parallelism be higher when such additional parallelism is included. The planes can be formed on a single die or on multiple die.

At the top of FIG. 25, Plane 0,0 and Plane 0,1 are arranged as Plane 0 and Plane 1 for the embodiment of FIG. 24 and receive the inputs $I^{0,0,n}$ for Plane 0,0 and $I^{0,1,n}$ for Plane 0,1. Plane 0,0 and Plane 0,1 compute the outputs of layer-0 using block and plane-level parallelism to generate inputs $I^{1,0,n}$ and $I^{1,1,n}$ for the next stages in the pipeline of Plane 1,0 and Plane 1,1. In the lower part of FIG. 25, Plane 1,0 and Plane 1,1 are arranged as for the previous pipeline stage in Plane 0,0 and Plane 0,1, but now store the weight matrix entries $W^{l,n,n}$ (again stored in transposed form) of the second rather than the $W^{0,n,n}$ entries of the first layer. By supplying the outputs of the first stage to the second stage and applying the inputs $I^{1,0,n}$ and $I^{1,1,n}$ to the layer-1 matrix entries, the outputs of layer-1 are then computed.

It should be noted that the weights of different layers can be stored in the same block, same plane, or both, although this reduces the degree of parallelism as the matrix multiplication of the different layers would not be performed concurrently. This is illustrated by the embodiment of FIG. 26.

Figure 26:
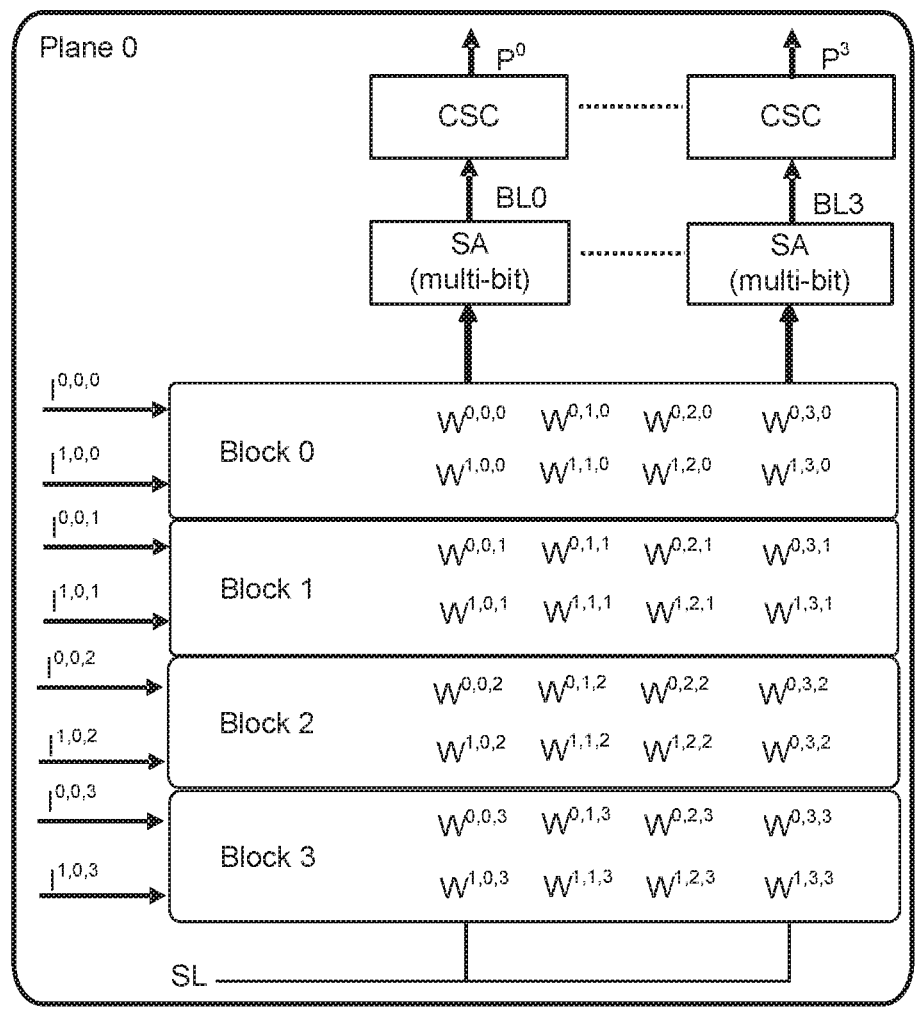
FIG. 26 illustrates an embodiment in which weights of different layers can be stored in the same block, same plane, or both.

FIG. 26 illustrates an embodiment in which weights of different layers can be stored in the same block, same plane, or, in this case, both. More specifically, FIG. 26 shows one plane with the inputs for two layers on one plane, with weights for each in the same block. In this example, the layer 1 weights that were in Plane 1,0 of FIG. 25 are now in the same blocks with the layer 0 weights that were in Plane 0,0 of FIG. 25. Thus, Block 0 in FIG. 26 includes the weights for Input<0> and Input<1> for both of layer 0 and layer 1, and Block 1 includes the weights for Input<2> and Input<3> for both of layer 0 and layer 1. The inputs $I^{0,0,n}$ for layer 0 generate the outputs $P^n$ of $I^{1,0,n}$ for layer 0 can then be computed as described with respect to FIG. 22 in a first set of reads. The $I^{l,0,n}$ the serve as the input for layer 1, again as described with respect to FIG. 22, but with the layer 1 weight matrix values $W^{l,n,n}$ to generate the layer 1 outputs in a second set of reads.

The embodiments above present methods and architecture to realize the inference phase of a binary neural network with binary inputs and binary weights in a NAND memory structure. By use of two serial connected memory cells as a unit synapse, binary weights of neural networks can be encoded and stored in a NAND memory array. These techniques allow for in-array implementations of matrix multiplication with improved inference accuracy when binary neural networks for large datasets and complicated deep neural network (DNN) structures.

Relative to a standard NAND-based architecture, the described embodiments preset a few small feature changes for the existing NAND memory architecture to support various levels of computing parallelism. For the program and erase operations, no circuit changes are needed. A modification is introduced on row, block, and/or plane decoders for controlling read operations to sense weights stored on the two-cell unit synapses, as these use double word line selection with different voltage control and, for multi-block embodiments, multiple blocks selection. To detect 0 inputs, a modified counter-based summation digital circuit is introduced along with a zero input detection circuit. By introducing a multi-bit sense amplifier, parallel computation across blocks and planes can also be used.

According to a first set of aspects, an apparatus includes an array of non-volatile memory cells and one or more control circuits connected to the array of non-volatile memory cells. The array of non-volatile memory cells are arranged as NAND strings and configured to store a plurality of weights of a neural network, each weight stored in a plurality of non-volatile memory cells on a common NAND string. The one or more control circuits are configured to receive a plurality of inputs for a layer of a neural network, convert the plurality of inputs into a corresponding plurality of voltage patterns, apply the plurality of voltage patterns to the array of non-volatile memory cells to thereby perform an in-array multiplication of the plurality of inputs with the weights, and accumulate results of the in-array multiplication.

In additional aspects, an apparatus includes an array of memory cells, a word line decoder, and a multi-bit sense amplifier. The array of memory cells includes: a bit line; a source line; and a plurality of NAND string, each including a plurality of memory cells and each connected between the bit line and the source line. The word line decoder is connected to the memory cells and configured to bias a first plurality of the NAND strings to perform a concurrent sensing operation on the first plurality of NAND strings. The multi-bit sense amplifier is connected to the bit line and configured to determine the number of the first plurality of NAND strings conducting in the concurrent sensing operation.

Further aspects include a method that includes receiving a plurality of input values and translating each of the plurality of input values input into a corresponding voltage pattern. Each voltage pattern is one of a plurality of voltage patterns comprising a set of N voltage values. The plurality of voltage patterns is applied to one or more NAND strings connected to a shared bit line. No more than one of the voltage patterns is applied to any single one of the NAND strings at a time and the set of N voltage values of each of the voltage patterns are applied to a corresponding N memory cells of the NAND string to which the voltage pattern is applied. The number of times that the one of the one or more NAND strings conduct is determined in response to the to the plurality of voltage patterns being applied to the to one or more NAND strings connected to the shared bit line.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   an array of non-volatile memory cells arranged as NAND strings and configured to store a plurality of weights of a neural network, each weight stored in a plurality of non-volatile memory cells on a common NAND string; and
   one or more control circuits connected to the array of non-volatile memory cells, the one or more control circuits configured to receive a plurality of inputs for a layer of a neural network, convert the plurality of inputs into a corresponding plurality of voltage patterns, apply the plurality of voltage patterns to the array of non-volatile memory cells to thereby perform an in-array multiplication of the plurality of inputs with the weights, and accumulate results of the in-array multiplication.

2. The apparatus of claim 1, wherein the non-volatile memory cells store data in a binary format.

3. The apparatus of claim 2, wherein the neural network is a binary neural network and each weight is stored in a pair of non-volatile memory cells, one of which is in a programmed state and the other of which is in an erased state.

4. The apparatus of claim 1, wherein:
   the array of non-volatile memory cells includes a plurality of NAND strings connected to a common bit line; and the one or more control circuits are further configured to concurrently apply the plurality of voltage patterns to the plurality of NAND strings connected to the common bit line and accumulate the results of the in-array multiplication in a multi-bit sensing operation for the common bit line.

5. The apparatus of claim 1, wherein the array of non-volatile memory cells includes:
a plurality of NAND strings connected to a common bit line;
and the one or more control circuits are further configured to sequentially apply the plurality of voltage patterns to the plurality of NAND strings connected to the common bit line and accumulate the results of the in-array multiplication in sequential sensing operations.

6. The apparatus of claim 1, wherein the array of non-volatile memory cells includes:
a first plurality of NAND strings each connected to a corresponding bit line; and
the one or more control circuits are further configured to concurrently apply a first of the plurality of voltage patterns to the first plurality of NAND strings and independently accumulate a result of the in-array multiplication for each of the first plurality of NAND strings concurrently.

7. The apparatus of claim 1, wherein the one or more control circuits are further configured to provide accumulated results of the in-array multiplication as inputs for a subsequent layer of the neural network.

8. The apparatus of claim 7, wherein the one or more control circuits are further configured to perform a subsequent in-array multiplication of the inputs for the subsequent layer of the neural network.

9. An apparatus, comprising:
an array of memory cells including:
a bit line;
a source line; and
a plurality of NAND strings, each including a plurality of memory cells and each connected between the bit line and the source line;
a word line decoder connected to the memory cells and configured to bias a first plurality of the NAND strings to perform a concurrent sensing operation on the first plurality of NAND strings; and
a multi-bit sense amplifier connected to the bit line and configured to determine a number of the first plurality of NAND strings conducting in the concurrent sensing operation.

10. The apparatus of claim 9, further comprising:
a counter connected to the multi-bit sense amplifier and configured to increment a count value by corresponding to the number of the first plurality of NAND strings conducting in the concurrent sensing operation.

11. The apparatus of claim 9, wherein each of the concurrent sensing operations includes:
simultaneously sensing a plurality of memory cells on each of the first plurality of NAND strings.

12. The apparatus of claim 11, wherein each of the plurality of memory cells on each of the first plurality of NAND strings corresponds to a weight of a neural network.

13. The apparatus of claim 12, wherein weights are binary weights.

14. A method, comprising:
receiving a plurality of input values;
translating each of the plurality of input values into a corresponding first voltage pattern, each first voltage pattern being one of a plurality of voltage patterns comprising a set of N voltage values;
applying the plurality of first voltage patterns to one or more NAND strings connected to a shared bit line, wherein no more than one of the first voltage patterns is applied to any single one of the NAND strings at a time and the set of N voltage values of each of the first voltage patterns are applied to a corresponding N memory cells of the NAND string to which the first voltage pattern is applied; and
determining a number of times that the one of the one or more NAND strings conduct in response to the to the plurality of first voltage patterns being applied to the to one or more NAND strings connected to the shared bit line.

15. The method of claim 14, wherein N=2 and the two memory cells to which each one of the first voltage patterns are applied includes a first memory cell in an erased state and a second memory cell is a programmed state.

16. The method of claim 14, wherein the input values correspond to the inputs for a layer of a binary neural network and data stored in two memory cells to which each one of the first voltage patterns are applied is a weight of a binary neural network.

17. The method of claim 14, wherein:
applying the plurality of first voltage patterns to the one or more NAND strings connected to the shared bit line includes concurrently applying each of the plurality of first voltage patterns to a corresponding one of the NAND strings; and
determining the number of times that the one of the one or more NAND strings in response to the plurality of first voltage patterns being applied thereto includes performing a multi-bit sensing operation.

18. The method of claim 14, wherein:
applying the plurality of first voltage patterns to the one or more NAND strings connected to the shared bit line includes sequentially applying each of the plurality of first voltage patterns to a corresponding one of the NAND strings; and
determining the number of times that the one of the one or more NAND strings in response to the plurality of first voltage patterns being applied thereto includes performing a plurality of sequential sensing operation.

19. The method of claim 14, further comprising:
concurrent with applying the plurality of first voltage patterns to the one or more NAND strings connected to a shared bit line, applying the plurality of first voltage patterns to the one or more NAND strings connected to an additional bit line; and
determining the number of times that the one of the one or more NAND strings connected to the additional bit line conduct in response to the to the plurality of first voltage patterns being applied to the to one or more NAND strings connected to the additional bit line.

20. The method of claim 14, wherein applying the plurality of first voltage patterns to one or more NAND strings connected to a shared bit line includes:
applying a pass voltage to memory cells of the one or more NAND strings other than the N memory cells to which the first voltage pattern is applied.

* * * * *